United States Patent [19]

Kamaji et al.

[11] Patent Number: 4,979,467
[45] Date of Patent: Dec. 25, 1990

[54] THIN FILM FORMATION APPARATUS

[75] Inventors: Hideki Kamaji, Atsugi; Shin Araki, Yokohama, both of Japan

[73] Assignee: Fujitsu Limited, Kawasaki, Japan

[21] Appl. No.: 347,876

[22] Filed: May 5, 1989

[30] Foreign Application Priority Data

| May 6, 1988 | [JP] | Japan | 63-109195 |
| Jun. 23, 1988 | [JP] | Japan | 63-156220 |
| Nov. 8, 1988 | [JP] | Japan | 63-280496 |
| Dec. 13, 1988 | [JP] | Japan | 63-312860 |

[51] Int. Cl.$^5$ ............................................. C23C 16/50
[52] U.S. Cl. ................................. 118/723; 427/39
[58] Field of Search ................ 118/723; 156/345; 204/298; 427/38, 39

[56] References Cited

U.S. PATENT DOCUMENTS

| 4,496,448 | 1/1985 | Tai et al. | 204/192.32 |
| 4,633,809 | 1/1987 | Hirose et al. | 118/723 |
| 4,681,653 | 7/1987 | Purdes et al. | 204/164 |

FOREIGN PATENT DOCUMENTS

| 59-193265 | 11/1984 | Japan | 118/723 |
| 59-193266 | 11/1984 | Japan | 118/723 |
| 59-205470 | 11/1984 | Japan | 118/723 |
| 60-116126 | 6/1985 | Japan | 118/723 |
| 60-162777 | 8/1985 | Japan | 118/723 |
| 61-143579 | 7/1986 | Japan | 118/723 |
| 63-58924 | 3/1988 | Japan | 118/723 |

OTHER PUBLICATIONS

Gill, M. D., "Sustaining Mechanisms in RF Plasmas", Vacuum, vol. 34, Nos. 3-4, (1984), pp. 357-364.

Primary Examiner—Shrive Beck
Assistant Examiner—Terry J. Owens
Attorney, Agent, or Firm—Staas & Halsey

[57] ABSTRACT

An apparatus for forming thin films on substrates includes a reactor vessel, and discharge and grounded electrodes opposably disposed within the reactor vessel. The discharge electrode has walls surrounding a hollow space having an outlet that is open to the grounded electrode. A starting gas is introduced into the reactor vessel through that hollow space. A radio frequency voltage is applied between the discharge and grounded electrodes to produce a discharge plasma zone therebetween. The potential of the discharge electrode is biased toward the negative side so that the discharge electrode behaves as a cathode to which a direct current voltage is applied, whereby a high density plasma is obtained in the hollow space of the discharge electrode.

12 Claims, 18 Drawing Sheets

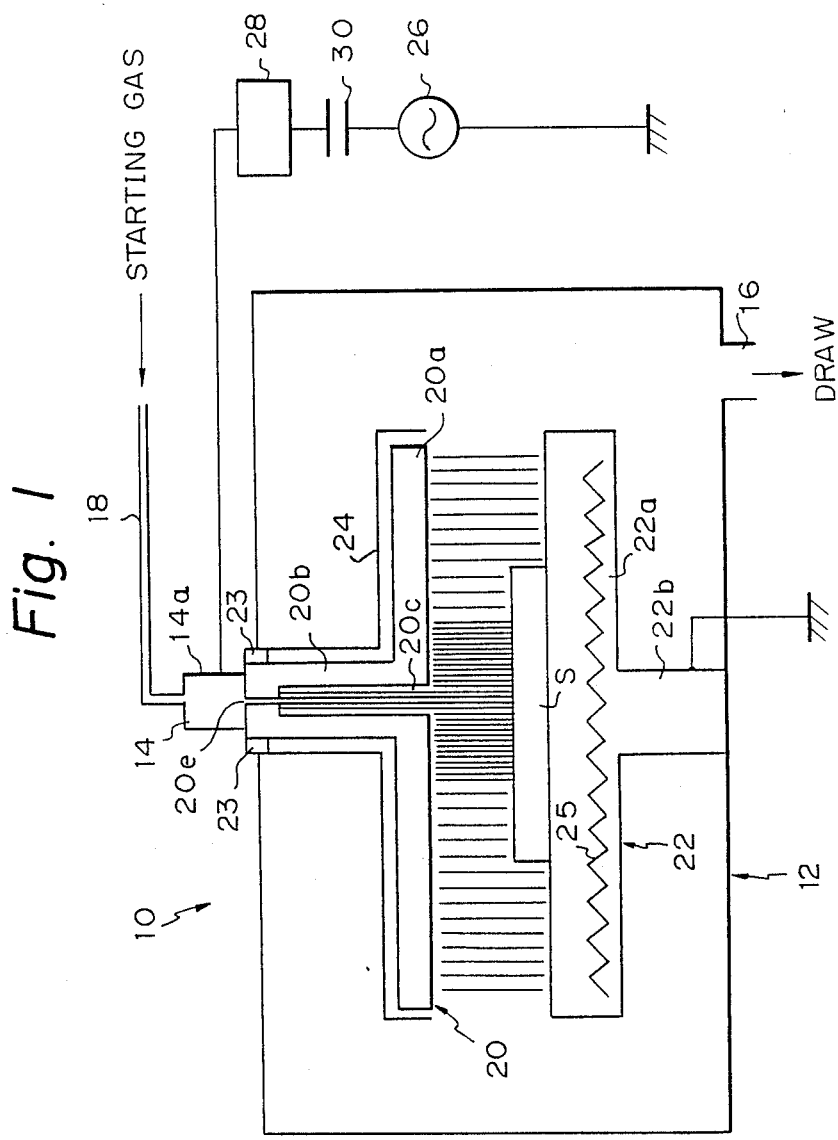

THIN FILM FORMATION APPARATUS

BACKGROUND OF THE INVENTION

1. Field of the Invention

The present invention relates to an apparatus for forming a thin film from a semiconductor such as hydrogenated amorphous silicon, or an insulator such as hydrogenated amorphous carbon, or the like on a substrate, and in particular, relates to a thin film formation apparatus in which a chemical vapor deposition (CVD) process is utilized for the formation of a thin film.

2. Description of the Related Art

Various types of CVD processes are known for the formation of thin films on substrates, for example, the thermal decomposition CVD process, the photo-assisted CVD process, and the plasma-assisted CVD process.

In the thermal decomposition CVD process, a gas of a starting material (hereinafter referred to as a starting gas) is thermally decomposed and activated within a reactor vessel to produce active species as decomposition products, and these active species are deposited on a substrate to form a thin film thereon. In general, in this type of process, the substrate is heated to a high temperature so that the decomposition of the starting gas occurs in the vicinity of a surface of the substrate. For this reason, the substrate must be formed of a material able to endure heating to a high temperature. Substrate materials usable in the thermal decomposition CVD process are restricted to materials which cannot be fused or deformed by heating. Also, if the substrate is overheated during the thermal decomposition CVD process, the thin film formed on the substrate may be unsatisfactory because a component of the deposited compound may be released therefrom due to the overheating of the substrate.

In the photo-assisted CVD process, a starting gas is decomposed and activated by light energy within a reactor vessel to produce active species as decomposition products, and the produced active species are deposited on a substrate as a thin film. The starting gas is irradiated by light having a wavelength in the ultraviolet band, which is liable to be absorbed by the starting gas to decompose the latter so that the active species are produced from the starting gas. In general, the source for the irradiation light may be a low-pressure mercury-vapor lamp, a deuterium discharge tube, or an ArF excimer laser device. The low-pressure mercury-vapor lamp and the deuterium discharge tube emit light continuously, but the intensity thereof is small and thus it is difficult to efficiently carry out the decomposition of the starting gas, resulting in a poor growth rate for the thin film. On the other hand, it is impossible to obtain a continuous light from the ArF excimer laser, since the ArF excimer laser beam is a pulsed light having a pulse frequency of less than 1 kHz. The life of any active species thus produced is shorter than one cycle of the pulse frequency, resulting in a deterioration of the characteristics of the deposited thin film. In addition, during photo-assisted CVD processes, the light is introduced into the reactor vessel through a glass window so that the decomposition of the starting gas is liable to occur in the vicinity of the glass window, whereby the produced active species may be deposited on the glass window, and thus, as more of the active species is deposited on the glass window, the introduction of the light through the glass window is impeded.

In the plasma-assisted CVD process, a starting gas is introduced into the plasma zone generated within a reactor vessel by utilizing either a direct current (DC) discharge, a radio frequency (RF) discharge or a microwave discharge. The introduced starting gas is caused to collide with electrons and ions in the plasma zone so that the starting gas is dissociated to produce active species which deposit on the substrate in the form of a thin film.

When a DC discharge is utilized in the plasma-associated CVD process, the formation of excellent thin film conductors can be carried out because a stable DC discharge may be easily maintained during the formation of thin film conductors, but it is impossible to carry out the formation of excellent thin film semiconductors or insulators because the DC discharge cannot be stably maintained during the formation of semiconductors and insulators. This is caused by the fact that the active species for the formation of semiconductors or insulators deposit not only on the substrate but also on the electrodes, so that electric resistance is gradually increased between the electrodes. Accordingly, the DC discharge plasma-assisted CVD process cannot be utilized for the formation of thin film semiconductors or insulators.

An RF discharge can be utilized in the plasma-assisted CVD process to form both thin film conductors and thin film semiconductors or insulators. Industrially, the RF discharge plasma-assisted CVD process is most widely used because the starting voltage at which the RF discharge occurs is relatively low, and because a stable plasma can be easily obtained over a wide area. Nevertheless, since the density of the plasma generated by RF discharge is low ($10^8$ to $10^{10}$ cm$^{-3}$), the growth rate of the thin film is low and the starting gas cannot be effectively consumed.

The RF discharge plasma-assisted CVD process is frequently used to form amorphous thin film semiconductors from materials such as hydrogenated amorphous silicon (a—Si:H), and in general, the formation of such amorphous thin film semiconductors is carried out in such a manner that the pressure within the reactor vessel (the pressure of the starting gas) is maintained within a range of from 0.1 to 10 torr.

When the formation of the amorphous thin film semiconductor is carried out within a high pressure range of from about 0.3 to 10 torr, the growth rate of the thin film is relatively high, but the amorphous thin film semiconductor may be defective. In particular, when the high pressure range of from 0.3 to 10 torr is employed, the active species dissociated from the starting gas collide with each other and the starting gas molecules so that high-molecular weight compounds are produced as a fine powder within the reactor vessel. For example, when the formation of a hydrogenated amorphous silicon (a—Si:H) thin film is carried out within the high pressure range of from 0.3 to 10 torr, high-molecular weight powders of $Si_nH_m$ (n, m=natural numbers) deriving from a starting gas such as $SiH_4$, $Si_2H_6$ or the like are produced, and these high-molecular powders may deposit together with the active species on the substrate, resulting in defects in the hydrogenated amorphous silicon thin film. Since the high-molecular powders also may deposit on the discharge electrodes and on the inner wall surfaces of the reactor vessel, the reactor vessel must be cleaned after every formation process, to remove the high-molecular powders. Furthermore, when the CVD reactor vessel is in communication with another reactor vessel through the intermediary of a valve, so that the substrate can be moved from one reactor vessel to another reactor vessel, the high-molecular powder may deposit on the valve, and thus the valve becomes unable to operate normally.

On the other hand, when the formation of the amorphous thin film semiconductor is carried out within a low pressure range of from about 0.1 to 0.3 torr, it is possible to prevent the production of the high-molecular weight powder because the probability of collisions among the active species and the starting gas molecules is considerably lowered due to the low pressure of the starting gas, whereby the formation of an excellent amorphous thin film semiconductor can be carried out without defects. This, however, means that the growth rate of the thin film is very low, and that the starting gas cannot be effectively consumed.

A microwave discharge can also be utilized in the plasma-assisted CVD process to form either thin film conductors or thin film semiconductors and insulators. In general, the microwave discharge plasma-assisted CVD process is performed by introducing microwaves into a reactor vessel through a waveguide. Although an antenna might be used for generating microwaves within a reactor vessel, the discharge plasma can be obtained only at a localized zone in the vicinity of the antenna, so a waveguide is generally used. The microwave discharge can be stably maintained even under a very low pressure of $10^{-4}$ torr by utilizing a magnetic field (electron cyclotron resonance (ECR)), so that the probability of collision between the starting gas molecules and electrons is considerably enhanced, whereby not only can the rate of the thin film deposition be increased, but also the starting gas can be effectively consumed. In the microwave discharge plasma-assisted CVD process, however, it is impossible to obtain a wide plasma zone because the cross-sectional area of the plasma zone is restricted to that of the waveguide due to the strong directivity of the microwave. By incorporating the cavity resonator into the reactor vessel, the plasma zone can be widened to the inner space of the cavity resonator, but the size of the cavity resonator is restricted by the frequency of the microwave used. For this reason, the microwave discharge plasma-assisted CVD process cannot be utilized to form a thin film on a large scale substrate. In addition, in general, the characteristics of thin films formed by the RF discharge plasma-assisted CVD process are inferior to those of thin films obtained by the microwave discharge plasma-assisted CVD process.

SUMMARY OF THE INVENTION

Therefore, an object of the present invention is to provide an apparatus for forming thin films on substrates utilizing a radio frequency discharge plasma, wherein not only is the growth rate of the thin film facilitated, but also the starting gas is effectively consumed even at low pressure ranges.

In accordance with the present invention, there is provided an apparatus for forming thin films on substrates, comprising a reactor vessel and first and second electrodes opposably disposed within the reactor vessel, and wherein the first electrode includes a hollow space which is open to the second electrode. The apparatus also includes introduction means for introducing a starting gas into the reactor vessel through the hollow space of the first electrode. The thin film formation apparatus according to the present invention also comprises a circuit including a radio frequency electric source for applying a radio frequency voltage between the first and second electrodes to provide a discharging plasma zone therebetween for dissociating the starting gas, the circuit being arranged so that the first electrode serves as a discharge electrode and the second electrode is grounded. The circuit further includes a biasing means for biasing a potential of the first electrode toward the negative side, whereby a high density plasma is provided in the hollow space of the first electrode.

In the present invention, the biasing means may comprise a blocking capacitor incorporated into the circuit. In this case, the first electrode has a discharge area equal to or preferably smaller than the area of the second electrode opposite to the discharge area of the first electrode. Under these conditions, the first electrode captures a part of the electrons generated at the beginning of the discharge between the first and second electrodes, so that the first electrode self-biases its potential to the negative side until the first electrode is saturated by the electrons.

On the other hand, the biasing means may comprise a direct current voltage source incorporated into the circuit. In this case, the potential of the first electrode is forcibly biased to the negative side.

BRIEF DESCRIPTION OF THE INVENTION

Other objects and advantages of the present invention will be better understood from the following description, with reference to the accompanying drawings, in which:

FIG. 1 is a schematic view showing a first embodiment of a thin film formation apparatus according to the present invention;

Figure 2A:
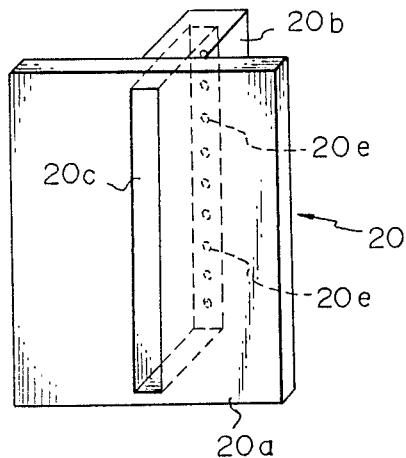
FIG. 2(a) is a perspective view showing a first electrode used in the embodiment of FIG. 1.
Figure 2C:
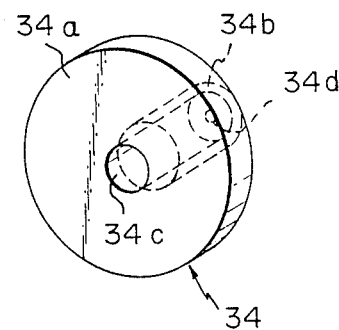
Figure 2B:
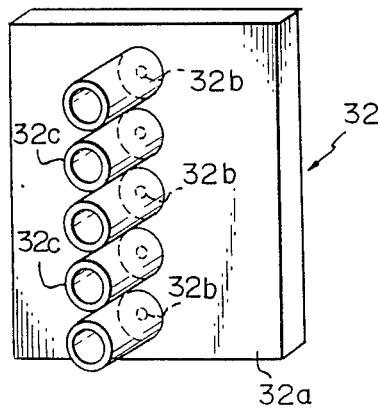
Figure 2D:
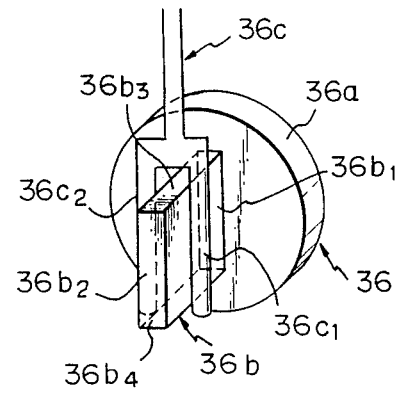
Figure 3:
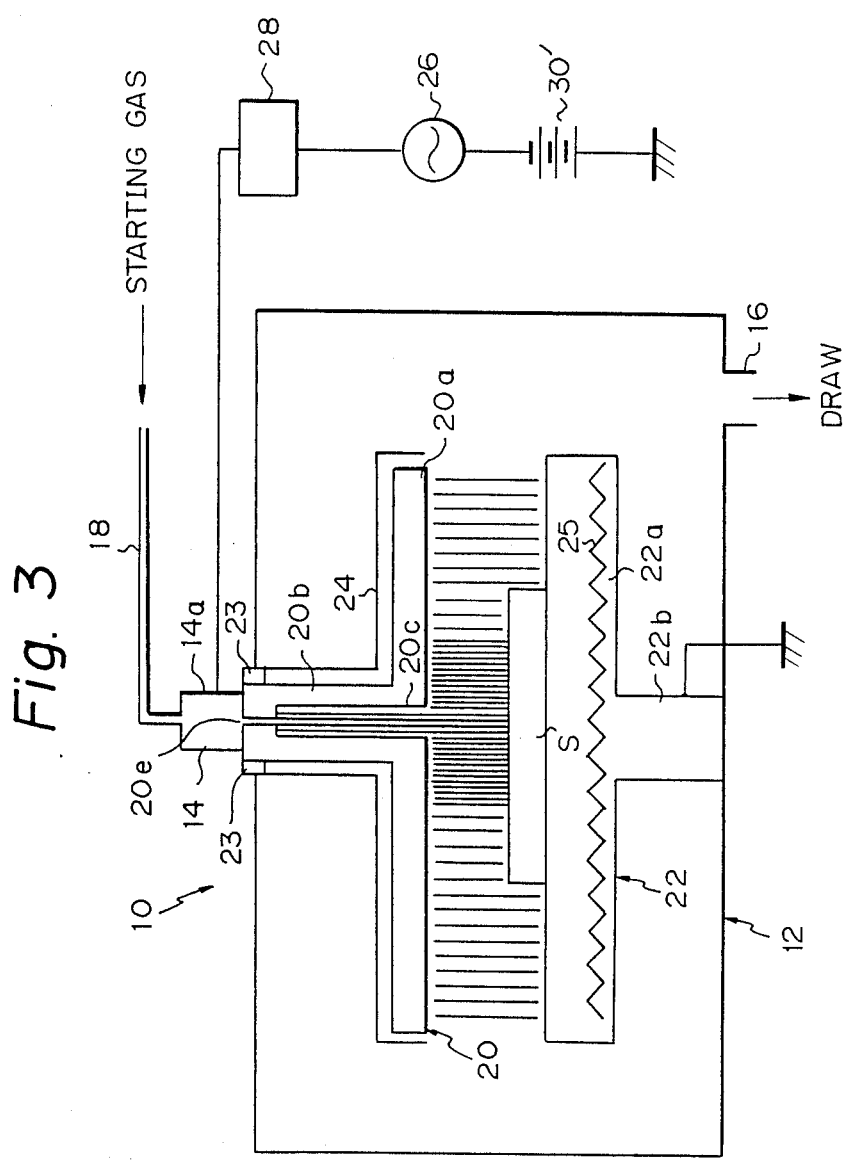
Figure 4:
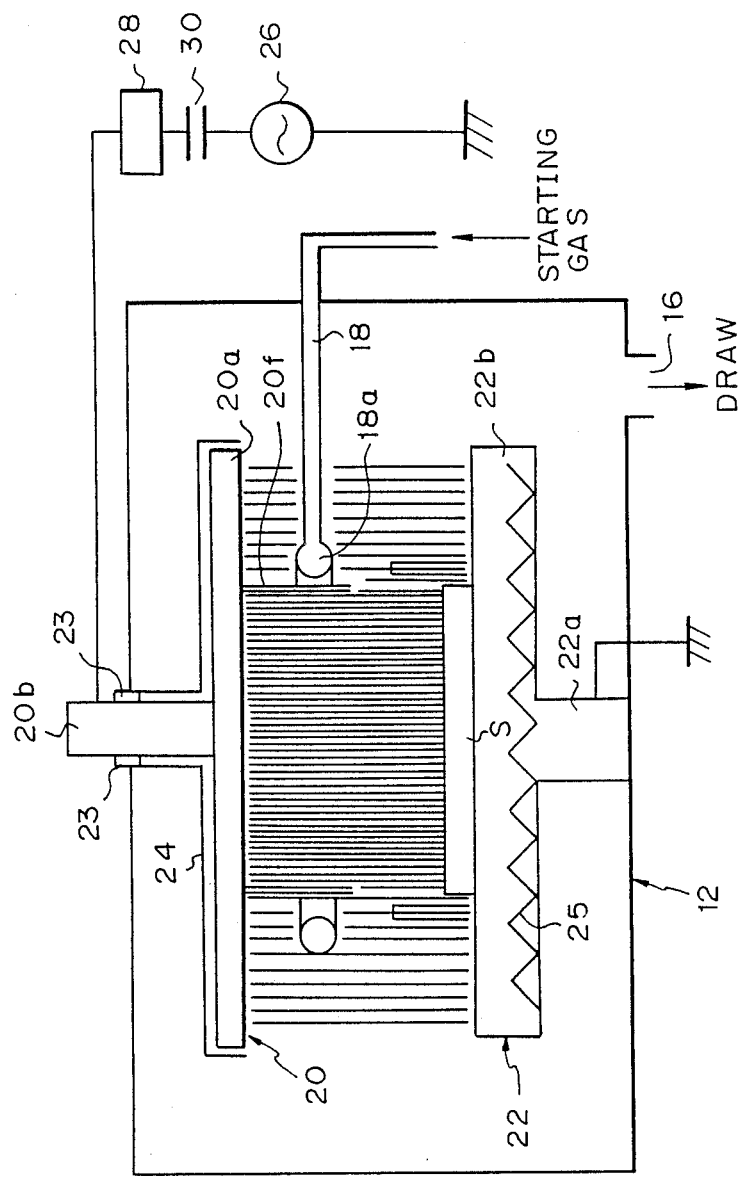
Figure 5:
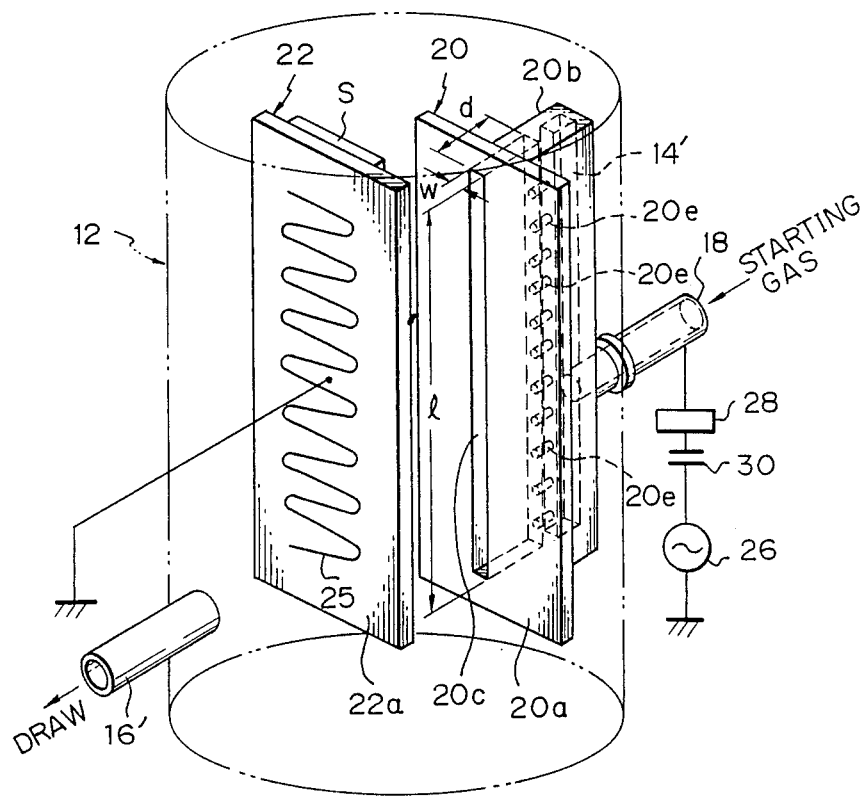
Figure 6:
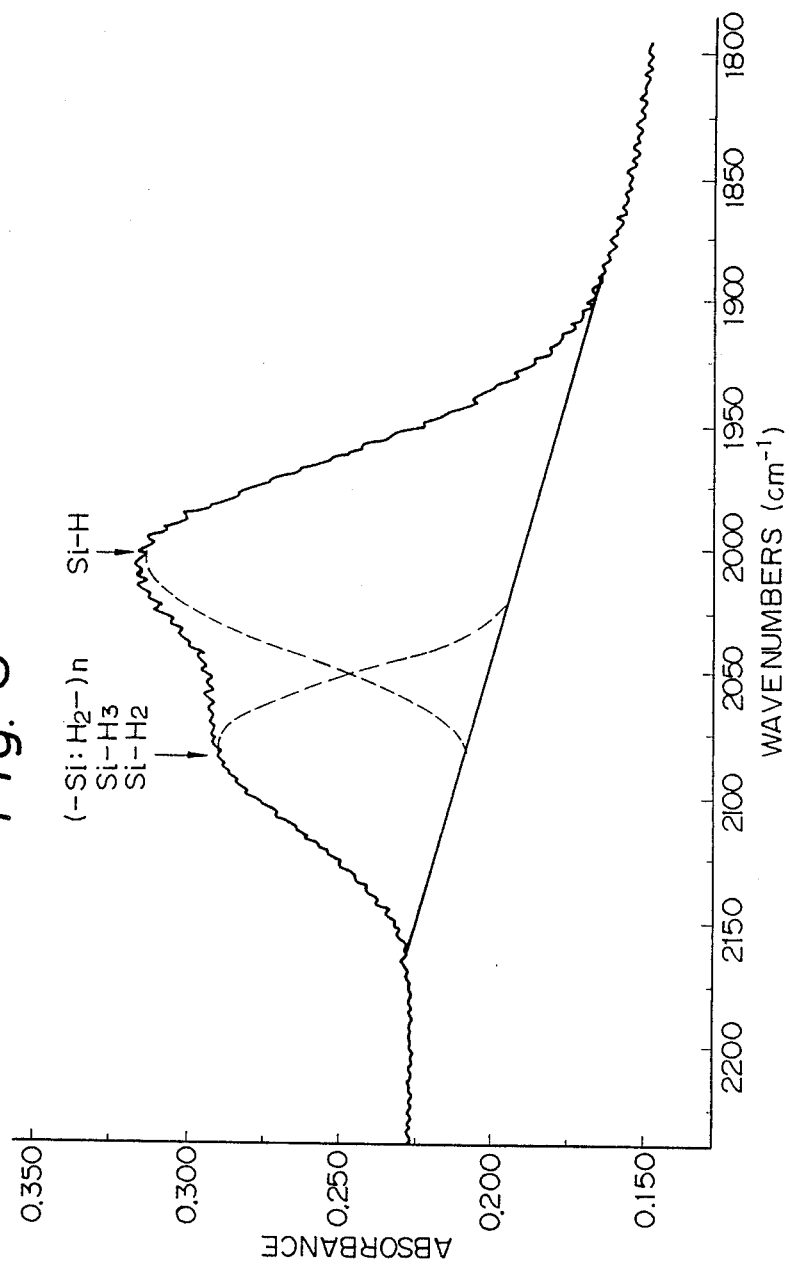
Figure 7A:
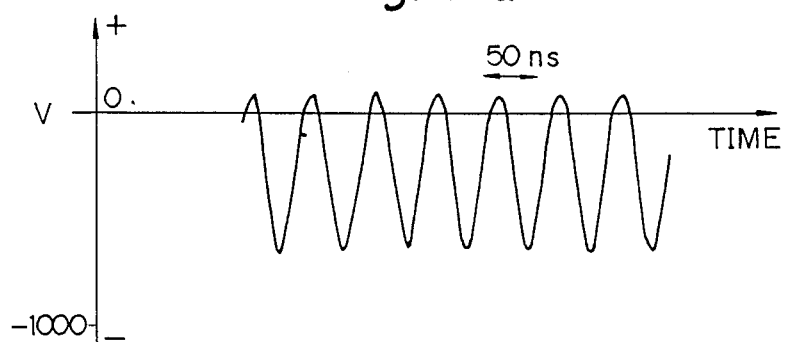
Figure 7B:
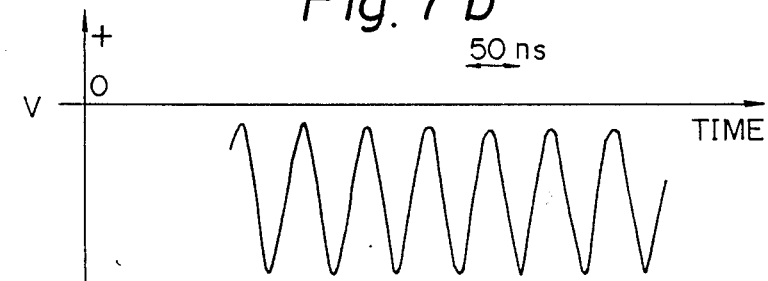
Figure 7C:
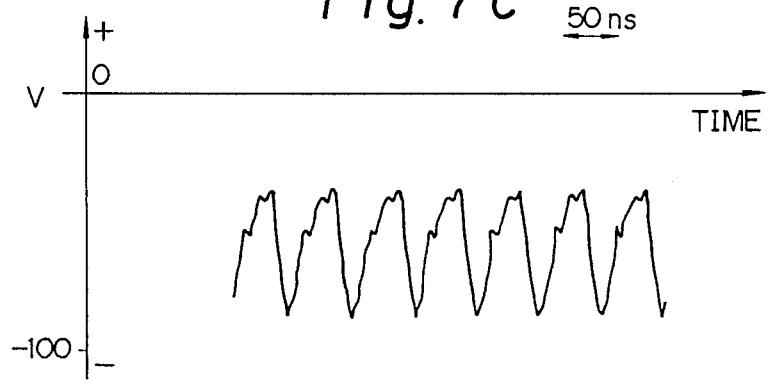
Figure 8A:
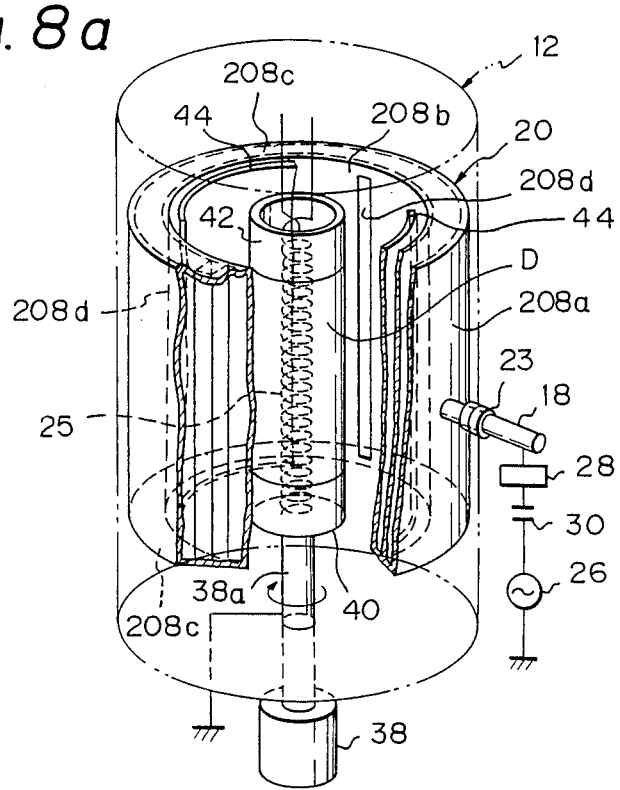
Figure 8B:
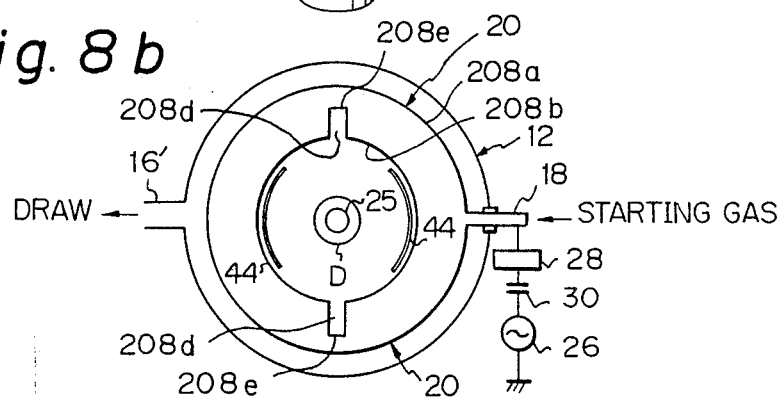
Figure 9:
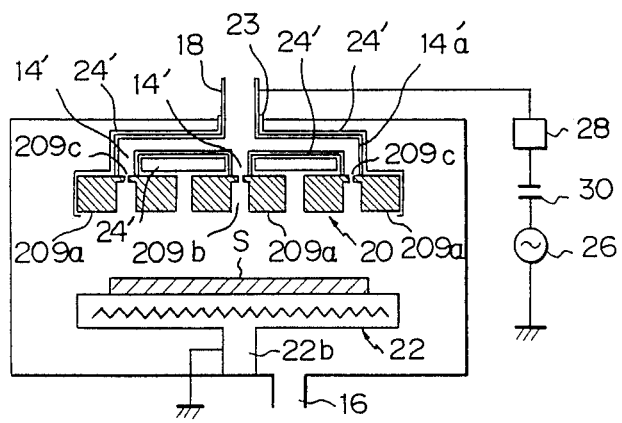
Figure 9:
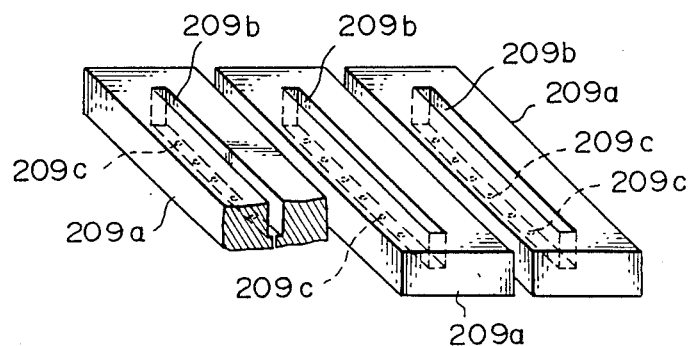
Figure 10:
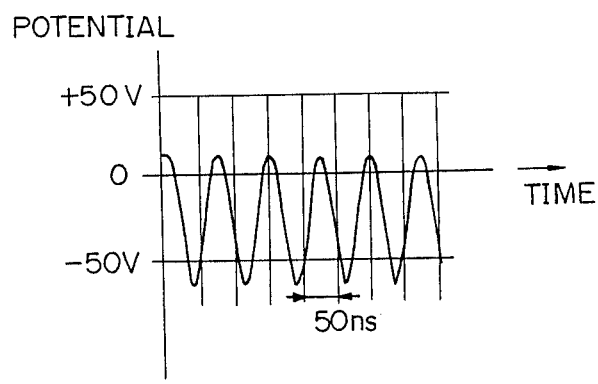
Figure 11:
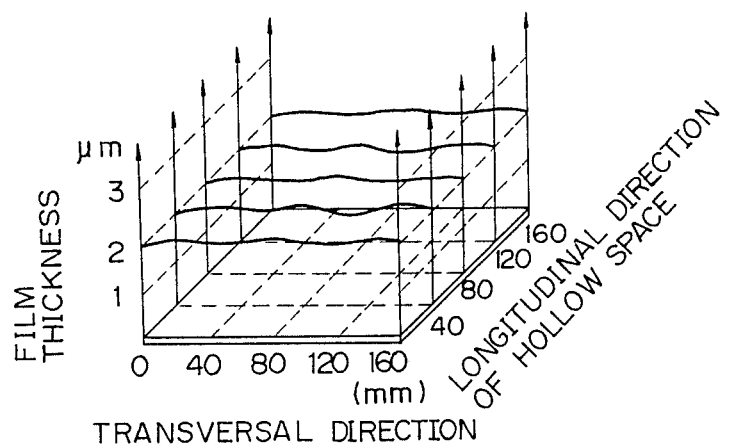
Figure 12:
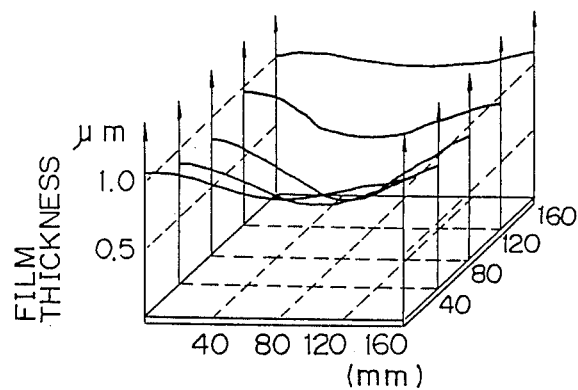
Figure 13:
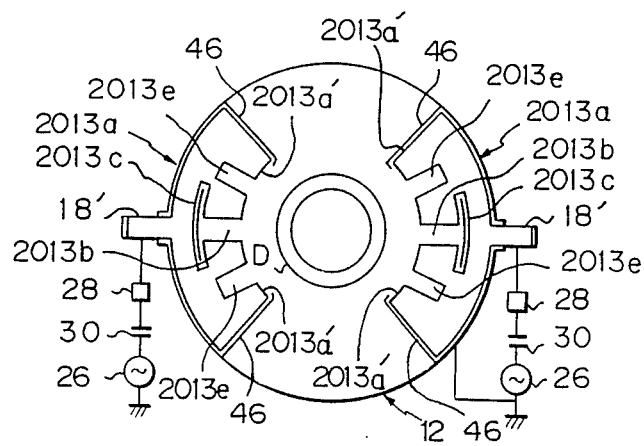
Figure 13:
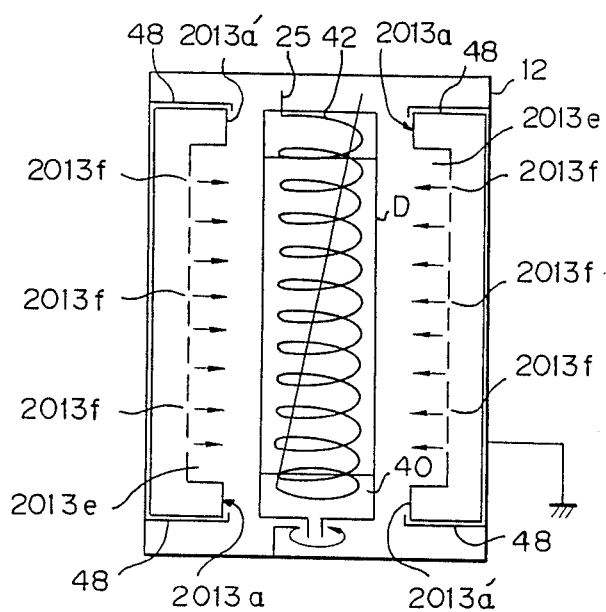
Figure 14:
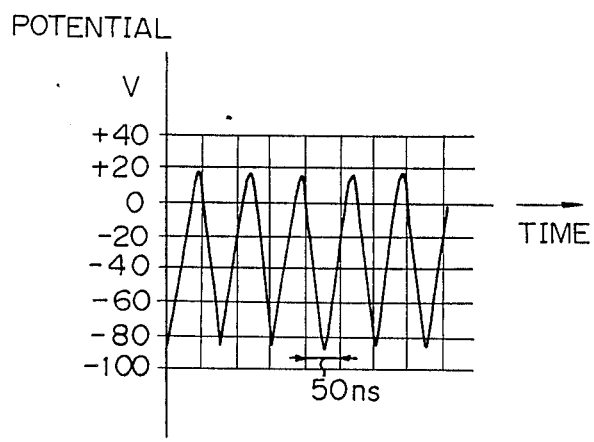
Figure 15:
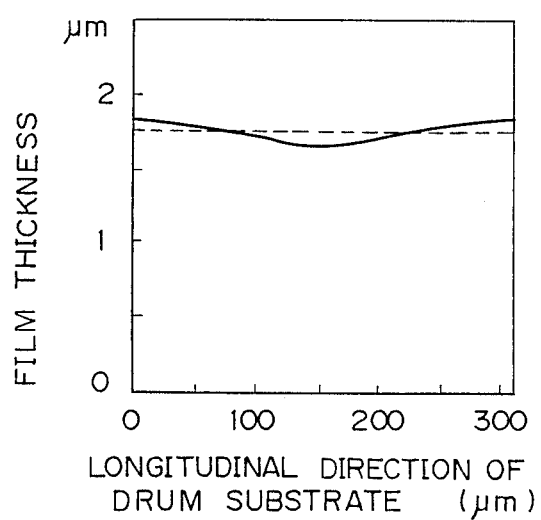
Figure 16:
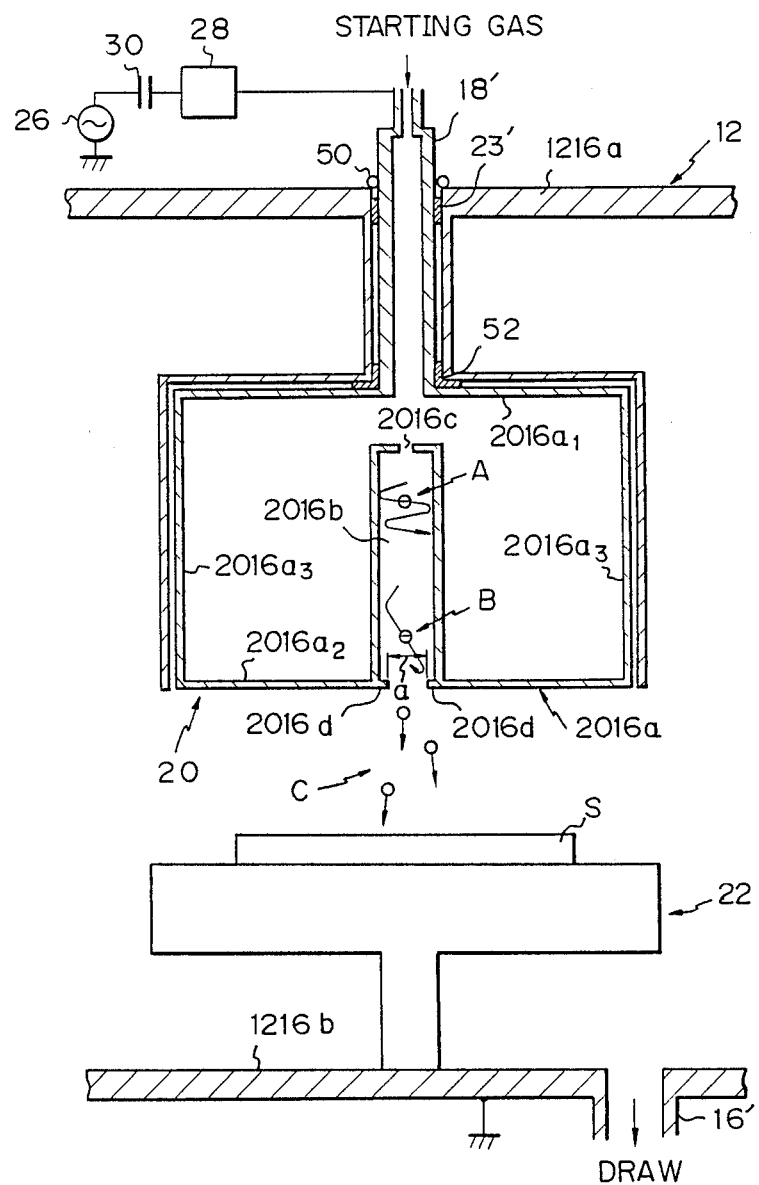
Figure 17A:
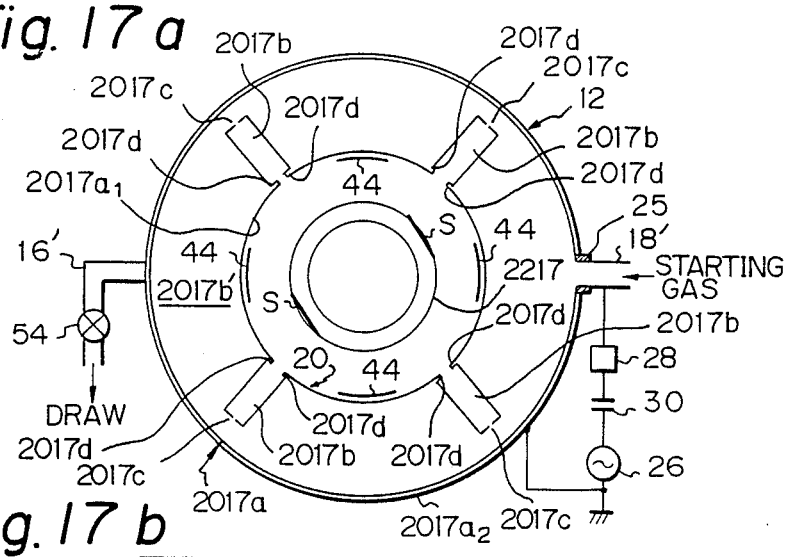
Figure 17B:
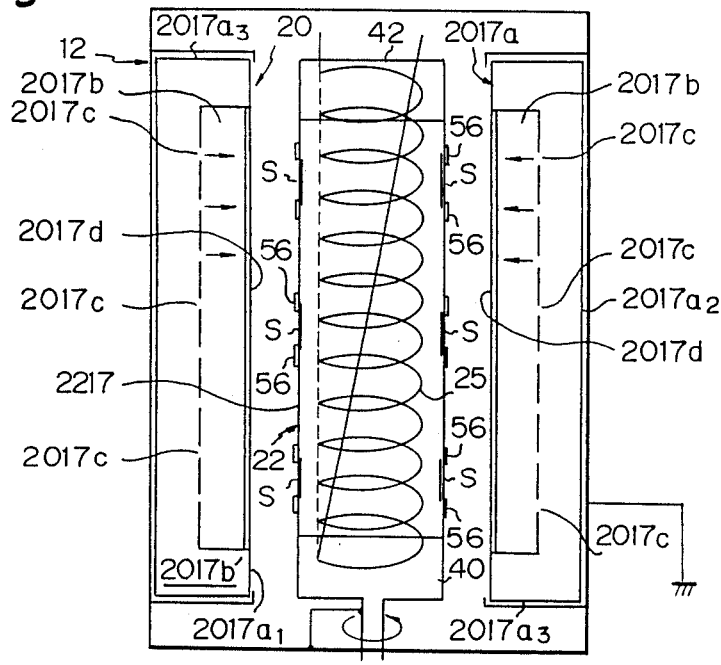
Figure 18:
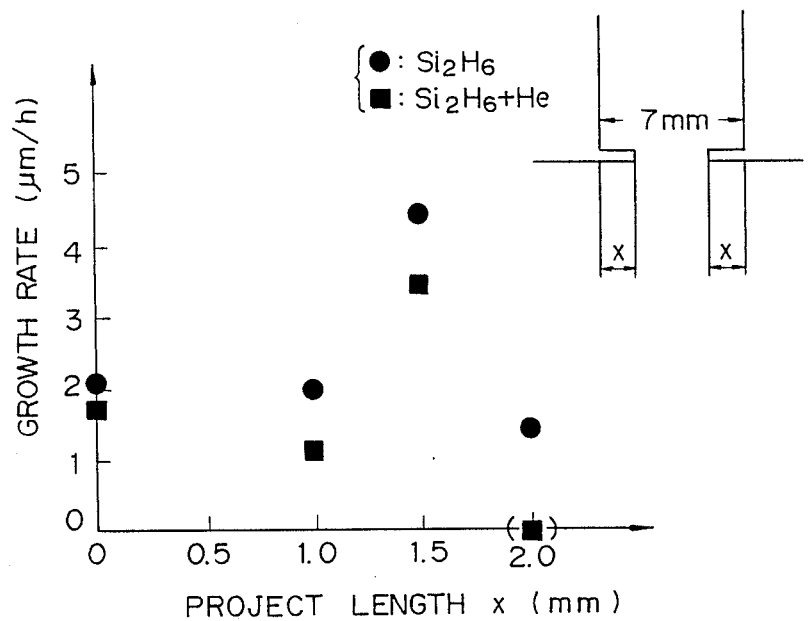
Figure 19:
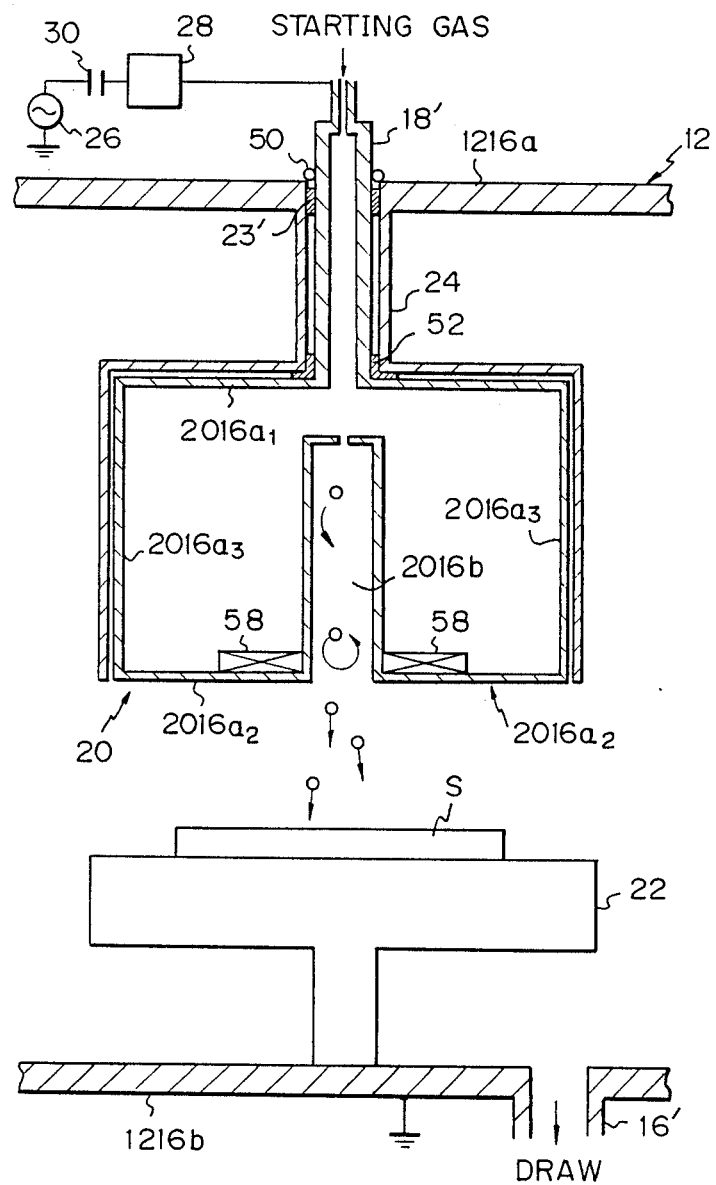

FIG. 2(b) to 2(d) are perspective views showing alternative forms of electrodes which may be used in place of the first electrode of FIG. 2(a);

FIG. 3 is a schematic view showing a modification of the first embodiment shown in FIG. 1;

FIG. 4 is a schematic view showing a second embodiment of a thin film formation apparatus according to the present invention;

FIG. 5 is a schematic view showing a third embodiment of a thin film formation apparatus according to the present invention;

FIG. 6 is a graph showing characteristics of a hydrogenated amorphous silicon thin film obtained in a thin film formation apparatus assembled according to the third embodiment of FIG. 5;

FIGS. 7(a) to 7(c) are graphs showing waveforms of the potential of the first electrode used in the thin film formation apparatus assembled according to the third embodiment of FIG. 5;

FIG. 8(a) is a schematic perspective view showing a fourth embodiment of a thin film formation apparatus according to the present invention;

FIG. 8(b) is a schematic cross-sectional view taken along a horizontal plane including a longitudinal axis of an inlet pipe forming a part of the thin film formation apparatus of FIG. 8(a);

FIG. 9(a) is a schematic view showing a fifth embodiment of a thin film formation apparatus according to the present invention;

FIG. 9(b) is a schematic perspective view showing discharge electrode elements used in the thin film formation apparatus assembled according to the fifth embodiment of FIG. 9(a);

FIG. 10 is a graph showing the waveform of the potential of the discharge electrode elements used in the thin film formation apparatus assembled according to the fifth embodiment of FIG. 9(a);

FIG. 11 is a three-dimensional graph showing the thickness distribution of a thin film formed by the thin film formation apparatus assembled according to the fifth embodiment of FIG. 9(a);

FIG. 12 is a three-dimensional graph showing the thickness distribution of a thin film formed by a conventional thin film formation apparatus;

FIGS. 13(a) and 13(b) are schematic views showing a sixth embodiment of a thin film formation apparatus according to the present invention, FIG. 13(a) being a horizontal cross-sectional view of FIG. 13(b) and FIG. 13(b) being a vertical cross-sectional view of FIG. 13(a);

FIG. 14 is a graph showing the waveform of the potential of the discharge electrode elements used in the thin formation apparatus assembled according to the fifth embodiment of FIG. 13(a) and 13(b);

FIG. 15 is a graph showing the thickness distribution of a thin film formed by a thin film formation apparatus assembled according to the fifth embodiment of FIG. 13(a) and 13(b);

FIG. 16 is a schematic view showing a seventh embodiment of a thin film formation apparatus according to the present invention;

FIGS. 17(a) and 17(b) are a schematic view showing an eighth embodiment of a thin film formation apparatus according to the present invention, FIG. 17(a) being a horizontal cross-sectional view of FIG. 17(b) and FIG. 17(b) being a vertical cross-sectional view of FIG. 17(a);

FIG. 18 is a graph showing the rate of thin film formation with respect to thin films produced by a thin film formation apparatus assembled according to the eighth embodiment of FIGS. 17(a) and 17(b);

FIG. 19 is a schematic view showing a ninth embodiment of a thin film formation apparatus according to the present invention; and FIGS. 20(a) and 20(b) are schematic Views showing a tenth embodiment of a thin film formation apparatus according to the present invention, FIG. 20(a) being a horizontal cross-sectional view of FIG. 20(b) and FIG. 20(b) being vertical cross-sectional view of FIG. 20(a).

DESCRIPTION OF THE PREFERRED EMBODIMENTS

Referring to FIG. 1, a thin film formation apparatus, generally designated by reference numeral 10, comprises a reactor vessel 12 having an inlet port 14 and an outlet port 16. The inlet port 14 is connected to one end of an inlet pipe 18, the other end of which is connected to a suitable starting gas source (not shown), and the outlet port 16 is connected to a suitable vacuum pump (not shown) such as a rotary pump or a mechanical booster pump.

The thin film formation apparatus 10 also comprises first and second electrodes 20 and 22 opposably disposed within the reactor vessel 12 to define a discharge zone therebetween; the first and second electrodes 20 and 22 being formed of a suitable conductive material such as a stainless steel.

In the embodiment of FIG. 1, the first electrode 20 is constructed as shown in FIG. 2(a). That is to say, the first electrode 20 includes a rectangular flat portion 20a and an upright portion 20b integrally projected from the flat portion 20a along the longitudinal axis of electrode 20. The upright portion 20b has a rectangular hollow space 20c formed therein, which extends through the flat portion 20a and opens at the discharge surface thereof. As can be seen from FIGS. 1 and 2(a), the upright portion 20b has a plurality of aligned opening holes 20e formed at the head thereof. The first electrode 20 is suspended from the top wall of the reactor vessel 12. In particular, the head of the upright portion 20b projects through the top wall of the reactor vessel 12 an is attached to the top wall of the reactor vessel 12 through the intermediary of an insulator 23. A header element 14a by which the inlet port 14 is defined is mounted atop the head of the upright portion 20b in such a manner that the inlet port 14 is in communication with the hollow space 20c through the opening holes 20e. The header element 14a is coextensive in length with the upright portion 20b so that all of the opening holes 20e open into the inlet port 14, and the header element 14a is formed of a suitable conductive material to establish an electrical connection between the header element 14a and the upright portion 20b of the first electrode 20. The first electrode 20 is covered by a shield 24 suspended from the top inner wall of the reactor vessel 12. The first electrode 20 is connected to a radio frequency electric source 26 through an impedance matching box 28 and a blocking capacitor 30; the RF source 26 being grounded as in FIG. 1.

The second electrode 22 includes a rectangular flat portion 22a and an extended portion 22b integrally and downwardly projected from the flat portion 22a. The second electrode 22 is mounted on the bottom inner wall of the reactor vessel 12, and is grounded as shown in FIG. 1. A substrate S is placed on the flat portion 22a at a predetermined location, and is heated by a suitable electric heater 25 incorporated therein. The flat portion 22a of the second electrode 22 is preferably wider than the flat portion 20a of the first electrode 20, for the reasons described hereinafter.

In operation, air is withdrawn from the reactor vessel 12 through the outlet port 16 by the vacuum pump until the pressure in the reactor vessel 12 is lower than $10^{-3}$ torr. Then the substrate S is heated to a predetermined temperature by the electric heater 25 while starting gas is successively introduced into the reactor vessel 12 through the inlet port 14, the opening holes 20e, and the hollow space 20c, so that the pressure therein is maintained at a predetermined level of from about 0.01 and about 0.3 torr. The vacuum pump is continuously driven.

When a predetermined RF voltage is applied between the first and second electrodes 20 and 22 by the RF electric source 26 so as to cause the RF discharge therebetween, the electrons generated by the RF discharge collide with the starting gas molecules so that a plasma zone is formed between the first and second electrodes 20 and 22. At the beginning of the RF discharge, the electrons, which are vibrated in the vicinity of the first electrode 20, are captured by the first electrode 20 due to the existence of the blocking capacitor 30, so that the potential of the first electrode 20 is self-biased toward the negative side. If the flat portion 22a of the second electrode 22 is wider than the flat portion 20a of the first electrode 20, i.e., if the opposed area of the flat portion 20a is smaller than that of the flat portion 22a, the capture of electrons by the first electrode 20 is facilitated.

When the first electrode 20 is saturated with captured electrons, the first and second electrodes 20 and 22 behave as a cathode and an anode, respectively, as if a direct current voltage were applied therebetween, so that the electrons existing in the hollow space 20c are rapidly vibrated by the electrical repulsion which the electrons receive from the hollow space wall. That is to say, the probability of collision between the electrons and the starting gas molecules in the hollow space 20c is considerably enhanced, so that a high density plasma is generated in the central portion of the discharge zone, which is in the vicinity of the hollow space 20c, as shown by the closely pitched lines in FIG. 1. As a result, the starting gas is introduced directly into a high density plasma and active species are more efficiently dissociated from the starting gas in comparison with the conventional RF discharge plasma-assisted CVD process, whereby not only is the growth rate of a thin film on the substrate S increased, but also the starting gas can be effectively consumed. In this case, of course, the production of high-molecular weight powders deriving from the starting gas is prevented because, although the density of the plasma (electrons) is increased, the pressure of the starting gas is maintained at a low level (0.01 to 0.3 torr). Further, a low density plasma is generated in the remaining portions of the discharge zone, as shown by the more widely pitched lines in FIG. 1. Of course, the dissociation of the starting gas can be also carried out in the low density plasma. And it should be noted that no discharge (plasma) is generated in the opening holes 20e because of the small size (about 2 mm) thereof.

FIGS. 2(b), 2(c) and 2(d) show modifications which are useable in place of the first electrode 2 in the thin film formation apparatus 10 of FIG. 1.

In FIG. 2(b), the electrode 32 includes a rectangular plate element 32a having a plurality of holes 32b formed therein, and sleeve elements 32c are attached to the plate element 32a at the locations of the holes 32b. The starting gas is introduced into the hollow spaces of the sleeve elements 32c through the respective holes 32b.

In FIG. 2(c), the electrode 34 includes a disc element 34a having a hole formed at the center thereof, and a cylindrical element 34b is attached to the disc element 34a at the center thereof and has a hollow space or bore 34c formed therein, the bore 34c extending through the disc element 34a and opening at the center thereof. A hole 34d is formed in the top of the cylindrical element 34b, and the starting gas is introduced into the hollow bore 34 through the hole 34d.

In FIG. 2(d), the electrode 36 includes a disc element 36a, a general rectangular parallelepiped-shaped mesh element 36b attached diametrically to the disc element 36a, and a fork-shaped pipe element 36c having branched pipe sections $36c_1$, $36c_2$ between which the mesh element 36b is disposed. The mesh element 36b includes a pair of wider side walls $36b_1$, $36b_2$ and a pair of narrower side walls $36b_3$, $36b_4$ which are formed of a suitable conductive mesh material such as a stainless steel mesh. The pipe sections $36c_1$ and $36c_2$ have opening holes (not shown) formed therein, and which are oriented toward the corresponding wider side wall $36b_1$, $36b_2$. The starting gas is ejected from the holes of the two-branched pipe sections $36c_1$ and $36c_2$, and then the ejected gas is introduced into the space defined by the side walls $36b_1$, $36b_2$, $36b_3$ and $36b_4$ through the wide side walls $36b_1$ and $36b_2$. Accordingly, the high density plasma can be obtained in the space defined by the side walls $36b_1$, $36b_2$, $36b_3$ and $36b_4$ in the same manner as in the hollow space 20c.

FIG. 3 shows a modification of the thin film formation apparatus 10 as shown in FIG. 1. In FIG. 3, the features similar to those of FIG. 1 are indicated by the same reference numerals. The modified apparatus is the same as in FIG. 1 except that a DC source 30' is used in place of the blocking capacitor 30 for biasing the potential of the first electrode 20 toward the negative side.

FIG. 4 shows a second embodiment of the present invention, which is generally similar to the thin film formation apparatus 10 as shown in FIG. 1. In FIG. 4, the features similar to those of FIG. 1 are indicated by the same reference numerals. In the second embodiment of FIG. 4, instead of forming the hollow space 20c in the upright portion 20b of the first electrode 20, the first electrode includes a cylindrical mesh element 20f formed of a stainless steel mesh and attached to the flat portion 20a so as to be suspended therefrom. The upright portion 20b is attached to the top wall of the reactor vessel 12 in the same manner as in FIG. 1, and is connected to the RF electric source 26 through the impedance matching box 28 and the blocking capacitor 30. The inlet pipe 18 for feeding the starting gas into the reactor extends through the side wall of the reactor vessel 12 and is connected to an annular pipe 18a surrounding the cylinder mesh element 20f. The annular pipe 18a has a plurality of opening holes (not shown) which are formed in the inner peripheral wall portion thereof so that the starting gas is ejected downwardly from the holes and toward the mesh element 20f at an angle of 35° with respect to the horizontal. The ejected starting gas thus is introduced into the inner space of the cylindrical mesh element 20f through the mesh wall thereof. Accordingly, the high density plasma, as shown by the closely pitched lines in FIG. 4, can be obtained in the hollow space inside the cylindrical mesh element 20f in the same manner as in the hollow space 20c of FIG. 1. On the other hand, the low density plasma is generated in the zone outside the cylindrical mesh element 20f, as shown by the widely pitched lines in FIG. 4.

To demonstrate an actual formation of a hydrogenated amorphous silicon (a—Si:H) thin film on the suitable substrate, a thin film formation apparatus corresponding to the second embodiment of FIG. 4 was assembled.

The assembled apparatus had the following characteristics:

| | |
|---|---|
| (A) Diameter of cylindrical mesh (20 f) | 50 mm |
| (B) Height of cylindrical mesh (20 f) | 25 mm |
| (C) Distance between first and second electrodes (20, 22) | 35 mm |
| (D) Distance between discharge surface of first electrode (20) and holes for starting gas | 15 mm |
| (E) Diameter of second electrode (22) | 100 mm |

The actual thin film formation was carried out under the following conditions:

| | |
|---|---|
| (A) Starting gas | $Si_2H_6$ |
| (B) Flow rate of starting gas | 2.0 sccm |
| (C) Pressure of starting gas | 0.06 torr |

| -continued | |
|---|---|
| (D) Power of RF source | 5.0 W |
| (E) Temperature of substrate | 230° C. |

It was observed that the growth rate of the thin film was 8.7 Å/s, and that the percentage of the starting gas consumed was 18%. Also, the finished hydrogenated amorphous silicon (a—Si:H) thin film exhibited a resistance of $3.7 \times 10^7 \Omega \cdot cm$ in the dark, and exhibited a resistance of $2.0 \times 10^{14} \Omega \cdot cm$ under the irradiation of a white lamp (1 mW/cm$^2$). Furthermore, no high-molecular weight powder (Si$_n$H$_m$) was generated during the operation.

The formation of another hydrogenated amorphous silicon (a—Si:H) thin film was actually carried out under the same conditions, except that the cylindrical mesh element was omitted from the above apparatus. This apparatus corresponds to a conventional RF discharge plasma-assisted CVD apparatus. It was observed that the growth rate of thin film was 1.3 Å/s, and that the percentage of starting gas consumed was about 3%.

A comparison of the above results proves that the growth rate of the thin film as well as the percentage of starting gas consumption are both considerably improved by the present invention.

FIG. 5 shows a third embodiment of the present invention, which is basically similar to the thin film formation apparatus 10 shown in FIG. 1. In FIG. 5, the features similar to those of FIG. 1 bear the same reference numerals and the features corresponding to those of FIG. 1 bear like reference numerals suffixed with a prime notation. The third embodiment is adapted to form a thin film on a relatively long substrate S.

In the third embodiment, the reactor vessel 12 is constructed in a cylindrical form, and is shown by the phantom line in FIG. 5. The first and second electrodes 20 and 22 are vertically and opposably disposed, and are suitable supported by the reactor vessel 12. The portion 20b projected from the flat portion 20a has the hollow space 20c which extends vertically along the longitudinal axis of portion 20b. In addition to the hollow space 20c, the projected portion 20b also has an elongated chamber 14' formed therein, which coextends vertically with the hollow space 20c, and is in communication with the hollow space 20c through the holes 20e formed between the elongated chamber 14' and the hollow space 20c. The inlet pipe 18 for feeding starting gas extends through the cylindrical side wall portion of the reactor vessel 12, and is connected to the projected portion 20b of the first electrode 20 in such a manner that the inlet pipe 18 is in communication with the elongated chamber 14'. Also, the inlet pipe 18 is formed of a suitable conductive material, and is connected to the RF electric source 26 through the impedance matching box 28 and the blocking capacitor 30. An outlet pipe 16' is connected to the cylindrical side wall portion of the reactor vessel 12 so as to be in communication with the reactor vessel, and the outer end of the outlet pipe is connected to a vacuum pump (not shown). The starting gas fed by the inlet pipe 18 is introduced into the elongated chamber 14', and is then ejected from the holes 20e into the hollow space 20c. Accordingly, the high density plasma can be obtained in the hollow space 20c in the same manner as in the first embodiment of FIG. 1.

A thin film formation apparatus corresponding to the third embodiment of FIG. 5 was actually assembled, and a formation of a hydrogenated amorphous silicon (a—Si:H) thin film on a suitable substrate was carried out.

The assembled apparatus had the following characteristics:

| (A) Discharge area of first electrode (20) | 464 × 136 mm |
|---|---|
| (B) Length l of hollow space (20 c) | 462 mm |
| (C) Width w of hollow space (20 c) | 8 mm |
| (D) Depth d of hollow space (20 c) | 28 mm |
| (E) Pitch of holes (20 e) | 40 mm |
| (F) Diameter of holes (20 e) | 2 mm |
| (G) Distance between first and second electrodes (20, 22) | 23 mm |

In the assembled apparatus, the first electrode should be covered by a shield except for the discharge surface thereof, so that discharge occurs only between the first and second electrodes.

The actual thin film formation was carried out under the following conditions:

| (A) Starting gas | Si$_2$H$_6$ |
|---|---|
| (B) Flow rate of starting gas | 50 sccm |
| (C) Pressure within reactor vessel | 0.07 torr |
| (D) Power of RF source | 100 W |
| (E) Substrate | quartz |
| (F) Temperature of substrate | 270° C. |

It was observed that the growth rate of thin film was 25.5 Å/s. Also, the finished hydrogenated amorphous silicon thin film (a—Si:H) exhibited a resistance of $6.9 \times 10^{10} \Omega \cdot cm$ in the dark, and exhibited a resistance of $8.6 \times 10^6 \Omega \cdot cm$ under irradiation of a white lamp (1 mW/cm$^2$). Furthermore, no high-molecular weight powder (Si$_n$H$_m$) was generated during the operation.

The formation of another hydrogenated amorphous silicon (a—Si:H) thin film was actually carried out under the same conditions, except that in place of the discharge electrode with the hollow space, a discharge electrode without a hollow space was used. This apparatus corresponds to a conventional RF discharge plasma-assisted CVD apparatus. It was observed that the growth rate of thin film was 13.8 Å/s. Also, the finished hydrogenated amorphous silicon (a—Si:H) thin film exhibited a resistance of $3.0 \times 10^{10} \Omega \cdot cm$ in the dark, and exhibited a resistance of $3.2 \times 10^6 \Omega \cdot cm$ under irradiation of a white lamp (1 mW/cm$^2$). Furthermore, no high-molecular weight powder (Si$_n$H$_m$) was generated during the operation.

As is apparent from a comparison of the above results, the growth rate of the film was considerably improved by the present invention.

Also, the a—Si:H thin film obtained according to the present invention was evaluated with respect to the hydrogen content thereof and the number of silicon-hydrogen bonds by using a Fourier transform infrared spectrometer. The results are shown in FIG. 6, wherein the characteristic represents the absorbance spectrums deriving from the stretching mode vibration of Si—H. From the characteristic of FIG. 6, it is found that the hydrogen content was 8.7 at %, and that the obtained a—Si:H thin film included Si—H$_m$ (m>2). However, it also was found that the amount of Si—H$_3$ and (—SiH$_2$—)$_n$ which deteriorate the photoconductivity of the a—Si:H thin film was small.

Furthermore, in the thin film formation apparatus according to the third embodiment (FIG. 5), the relationship between the stability of the plasma and the potential of the discharge electrode was investigated with respect to each of monosilane $SiH_4$, disilane $Si_2H_6$, argon Ar, helium He, Hydrogen $H_2$, and mixtures thereof which were used as the discharge gas. As a result, it was observed that the pressure range of the discharge gas, the power range of the RF electric source, and the flow rate range of the discharge gas necessary for stabilization of the generated plasma varied according to the kind of discharge gas used, but in general, the following findings were obtained:

(1) When a bright plasma is stably generated in the hollow space, the potential of the discharge electrode varies as shown in FIGS. 7(a) and 7(b). This waveform essentially correspond to the original waveform of the RF electric source.

(2) When a bright plasma is partially generated in the hollow space, i.e., when the generated plasma includes a dark area, the potential of the discharge electrode varies as shown in FIG. 7(c). This waveform of FIG. 7(c) includes some disturbance, in comparison with the original waveform of the RF electric source.

(3) When the dark area of the generated plasma is varied so as to be alternately widened and narrowed over a relatively long period, the waveform of FIG. 7(b) is shifted upwardly and downwardly in response to the variation of the dark area.

(4) Although the plasma is unstably generated, the disturbance of the waveform as shown in FIG. 7(c) does not appear, depending on the requirements of the discharge.

From the results shown above, it can be understood that, when the potential of the discharge electrode is strongly biased to the negative side, the generation of plasma becomes unstable. Accordingly, during the formation of a thin film, it is necessary to maintain the potential of the discharge electrode as shown in FIGS. 7(a) and 7(b).

FIGS. 8(a) and 8(b) show a fourth embodiment of the present invention, which is basically similar to the thin film formation apparatus 10 as shown in FIG. 1. In FIG. 8(a) and 8(b), the features similar to those of FIG. 1 bear the same reference numerals and the features corresponding to those of FIG. 1 bear like reference numerals suffixed with a prime notation. The fourth embodiment is adapted to produce a photoreceptor drum used in the electrophotographic field.

In the fourth embodiment the reactor vessel 12 is constructed in a cylindrical form, and is shown by the phantom line in FIG. 8(a). The first electrode 20 is concentrically disposed within the cylindrical reactor vessel 12. As shown in FIGS. 8(a) and 8(b), the electrode 20 has a double-wall construction with an interior annular chamber. The electrode 20 includes an outer cylindrical wall portion 208a, an inner cylindrical wall portion 208b, and two annular end wall portions 208c, by which the interior annular chamber is defined. The inner cylindrical wall portion 208b has two diametrically opposed hollow spaces or elongated grooves 208d formed therein which extend along the generatrix thereof. Each of the grooves 208d has a bottom wall section by which a part of each groove is defined and in which a plurality of opening holes 208e are formed, as shown in FIG. 8(b). These opening holes 208e are aligned with each other along the longitudinal axis of each groove 208d.

In the fourth embodiment, the inlet pipe 18 for feeding the starting gas extends through the cylindrical side wall portion of the reactor vessel 12, and is connected to the outer cylindrical side wall portion 208a of the first electrode 20 in such a manner that the inlet pipe 18 is in communication with the interior annular chamber of the first electrode 20. Also, the inlet pipe 18 is formed of a suitable conductive material and is connected to the RF electric source 26 through the impedance matching box 28 and the blocking capacitor 30. An outlet pipe 16′ is connected to the cylindrical side wall portion of the reactor vessel 12 so as to be in communication with the reactor vessel 12, and the outer end of the outlet pipe is connected to a vacuum pump (not shown).

In the fourth embodiment, the substrate per se serves as the grounded electrode. For example, the substrate may comprise an aluminum drum blank D concentrically disposed within the cylindrical discharge electrode 20 and which is able to be rotated around the longitudinal axis thereof. In particular, a suitable electric motor 38 is disposed beneath the reactor vessel 12 so that an output shaft 38a of the motor 38 extends through the bottom of the reactor vessel 12 along the longitudinal axis thereof, and the output shaft 38a of the motor 38 is provided with a sleeve-like mount 40 for the drum blank D, a diameter of the mount 40 being the same as that of the drum blank D. The mount 40 is adapted to cooperate with a sleeve-like clamp member 42 so that the drum blank D is fixed on the mount 40 by the clamp member 42, a diameter of the clamp member 42 also being the same as that of the drum blank D. The mount 40 and the clamp member 42 are formed of a suitable conductive material, so that the mount 40 and clamp member 42 also form a part of the grounded electrode. As shown in FIG. 8(a), the mount 40, the drum blank D, and the clamp 42 are grounded through the shaft 38a of the motor 38. Further, each of the mount 40 and the clamp member 42 forms a cylindrical surface portion which extends from the drum blank D, whereby an excellent thin film can be formed on the end sides of the drum blank D. The heater 25 for heating the substrate or the drum blank D comprises a spiral resistor element which extends through the drum blank D.

To bias the potential of the discharge electrode 20 toward the negative side, the discharge area of the first electrode 20, i.e., the peripheral area of the inner cylindrical wall portion 208b, must be larger than the peripheral area of the drum blank D (inclusive of the mount 40 and clamp 21). Accordingly, in the fourth embodiment, a pair of arcuate shield plate elements 44 are partially applied to the peripheral area of the inner cylindrical wall portion 208b of the first electrode 20, each of the shield elements 44 being grounded. As shown in FIGS. 8(a) and 8(b), the shield plate elements 44 are diametrically disposed within the discharge electrode 20 so as to be close to the inner wall surface thereof, whereby the discharge area can be restricted so that the potential of the discharge electrode 20 is biased toward the negative side.

In operation, the starting gas fed by the inlet pipe 18 is first introduced into the interior annular chamber of the first electrode 20, and is then ejected from the holes 208e into the hollow spaces 208d. Accordingly, a high density plasma can be obtained in the hollow spaces 208d in the same manner as in the first embodiment of FIG. 1. During operation, the drum blank D is rotated by the motor 38, whereby a thin film such as a photosensitive film can be uniformly formed on the drum blank D.

A thin film formation apparatus corresponding to the fourth embodiment of FIGS. 8(a) and 8(b) was actually assembled, and a B(boron)-doped a—Si:H thin film was formed on an aluminum drum blank.

The assembled apparatus had the following characteristics:

| (A) Length of hollow space (208 d) | 468 mm |
|---|---|
| (B) Width of hollow space (208 d) | 10 mm |
| (C) Depth of hollow space (208 d) | 20 mm |
| (D) Arcuate width of shield plate (44) | 45 mm |

In the assembled apparatus, the discharge electrode 20 was provided with four hollow spaces 208d disposed at regular intervals, four shield plates 44 were disposed between the four hollow spaces 208d, and the outer surface and the annular end faces were covered by a stainless shield.

The actual thin film formation was carried out under the following conditions:

| (A) Flow rate of starting gas | 100 sccm |
|---|---|
| (B) Pressure within reactor vessel | 0.05 torr |
| (C) Power of RF source | 300 W |
| (D) Temperature of drum blank | 250° C. |

The starting gas was disilane ($Si_2H_6$) gas to which diborane ($B_2H_6$) gas diluted with helium (He) gas was added, and to evaluate the finished B-doped a—Si:H thin film, a sample substrate of quartz was attached to a part of the drum blank from which a part of the blank material was removed.

It was observed that the growth rate of the B-doped a—Si:H thin film was 29 Å/s, and that the percentage of the starting gas consumption was 19%. Also, the finished B-doped a—Si:H thin film exhibited a resistance of $1.3 \times 10^{11} \Omega \cdot cm$ in the dark, and exhibited a resistance of $1.3 \times 10^{7} \Omega \cdot cm$ under irradiation by a white lamp. Accordingly, the produced drum is usable as a photoreceptor drum in the electrophotographic field.

FIGS. 9(a) and 9(b) show a fifth embodiment of the present invention, which is generally similar to the thin film formation apparatus 10 shown in FIG. 1. In FIGS. 9(a) and 9(b), the features similar to those of FIG. 1 are indicated by the same reference numerals and the features corresponding to those of FIG. 1 bear like references numerals suffixed with a prime notation.

In the fifth embodiment, the discharging electrode 20 comprises three discharge electrode elements 209a disposed in side by side relationship above the grounded electrode 22. As shown in FIG. 9(b), each of the discharge electrode elements 209a has an elongated rectangular parallelepiped shape and each has a hollow space or groove 209b formed therein, which extends along the longitudinal axis thereof. A plurality of longitudinally aligned opening holes 209c are formed in the elongated bottom of each groove 209b. The grounded electrode 22 is substantially identical to that of FIG. 1.

The inlet pipe 18 for feeding starting gas extends through the top wall of the reactor vessel 12, and is connected to a header 14a' having three elongated opening ports 14', each of which is substantially coextensive in length with the corresponding groove 209b. The discharge electrode elements 209a are attached to the header 14a' so that the opening ports 14' are closed by respective discharge electrode elements 209a, as shown in FIG. 9(a), and so that each of the opening ports 14' is in communication with the groove 209b of the corresponding electrode element 209a through the opening holes 209c thereof. The inlet pipe 18 and the header 14a' are formed of a suitable conductive material, and are connected to the RF electric source 26 through the impedance matching box 28 and the blocking capacitor 30. The header 14a' is covered by shield elements 24' so that discharge occurs only between the discharge electrode elements 209a and the grounded electrode 22.

In operation, starting gas fed by the inlet pipe 18 is first introduced into the header 14a', and is then ejected through the opening holes 209c into the hollow spaces or grooves 209b through the opening ports 14'. Accordingly, a high density plasma can be obtained in each of the hollow spaces 209b in the same manner as in the first embodiment of FIG. 1.

According to the fifth embodiment of FIGS. 9(a) and 9(b), the apparatus provides more than one high density plasma zone within the reactor vessel, whereby the formation of the thin film can be uniformly carried out over a wider area.

A thin film formation apparatus corresponding to the fifth embodiment of FIGS. 9(a) and 9(b) was actually assembled, and was used to form a hydrogenated amorphous silicon (a—Si:H) thin film on a plurality of substrates.

The assembled apparatus had the following characteristics:

| (A) Length of discharge electrode element (209 a) | 170 mm |
|---|---|
| (B) Width of discharge electrode element (209 a) | 50 mm |
| (C) Thickness of discharge electrode element (209 a) | 35 mm |
| (D) Length of hollow space (209 b) | 150 mm |
| (E) Width of hollow space (209 b) | 10 mm |
| (F) Depth of hollow space (209 b) | 30 mm |
| (G) Diameter of hole (209 c) | 1.5 mm |
| (H) Pitch of holes (209 c) | 20 mm |
| (I) Number of holes (209 c) | 7 |
| (J) Pitch of discharge electrode elements (209 a) | 30 mm |
| A thin film was formed under the following conditions | |
| (A) Starting gas | $SiH_4$ |
| (B) Flow rate of starting gas | 20 sccm |
| (C) Pressure within reactor vessel | 0.5 torr |
| (D) Power of RF source | 40 W |
| (F) Substrate | quartz |
| (G) Size of substrate | 40 × 40 mm |
| (H) Number of substrates | 16 |
| (I) Temperature of substrate | 250° C. |
| (J) Operation time | 20 min. |

During operation, the potential of the discharge electrode was observed as shown in FIG. 10.

It was observed that the average thickness of the produced a—Si:H thin film was 2.09 μm, and that the variation thickness was ±0.22 μm, Accordingly, the average growth rate of the thin film was 6.26 μm/h, and the variation was 8%. Also, it has been observed that the percentage of starting gas consumed was about 26%. Note, FIG. 11 shows the thickness distribution of the thin film produced according to the present invention.

Another thin film (a—Si:H) was formed in a conventional apparatus under the same conditions. It was observed that the average growth rate of the produced thin film was 2.56 μm/h, that the maximum variation was about 50%, and that the percentage of starting gas consumed was about 10%. FIG. 12 shows the thickness distribution of the thin film produced using the conventional apparatus.

A comparison of the above results proves that the growth rate of the thin film as well as the percentage of starting gas consumption were both considerably improved by the present invention.

The thus produced thin films were evaluated with respect to photo- and dark-resistivity ratio wherein $(\rho_d/\rho_p)$, wherein $\rho_d$ is resistance in the dark and $\rho_p$ is resistance under irradiation by a white lamp (1 mW/cm$^2$). When these thin films are used as the photoconductor for solar cells, photoreceptor drums or the like, the resistivity ratio $(\rho_d/\rho_p)$ is one of important factors. The results of the evaluation were as follows:

Invention: $4.6 \leq \text{Log}(\rho_d/\rho_p) \leq 4.9$
Prior Art: $4.7 \leq \text{Log}(\rho_d/\rho_p) \leq 5.1$ FIGS. 13(a) and 13(b) show a sixth embodiment of the present invention, which is similar to the thin film formation apparatus shown in FIGS. 8(a) and 8(b). In FIGS. 13(a) and 13(b), the features similar to those of FIGS. 8(a) and 8(b) bear the same reference numerals.

In the sixth embodiment, the discharge electrode 20 comprises two identical discharge electrode elements 2013a diametrically disposed within the reactor vessel 12. Each of the discharge electrode elements 2013a has a hollow construction and a sector-shaped cross section, as shown in FIG. 13(a), and each element 2013a has a central recess 2013b formed in the cylindrical inner wall portion thereof, that is extended along the longitudinal axis of the reactor vessel 12. Each central recess 2013b has a generally T-shaped cross section, the cross bar portion thereof having a shield plate element 2013c disposed therein, whereby each of the electrode elements 2013a is virtually divided into two discharge electrode sections 2013a'. Each of the discharge electrode sections 2013a' has a hollow space or groove 2013e formed in the cylindrical inner wall portion thereof and which extends along the longitudinal axis of the reactor vessel 12. As shown in FIG. 13(b), a plurality of longitudinally aligned opening holes 2013f are formed in the bottom of each groove 2013e. As shown in FIG. 13(a) and 13(b), the side faces of the discharge electrode elements 2013a are covered by shield plate elements 46, and the end faces of the discharge electrode elements 2013a are covered by shield plate elements 48. As shown in FIG. 13(a), each of the discharge electrode elements 2013a has an inlet pipe 18' that projects from the cylindrical outer wall portion thereof and extends through the adjacent cylindrical side wall portion of the reactor vessel 12. The inlet pipes 18' are connected to the RF electric source 26 through the impedance matching box 28 and the blocking capacitor 28.

In the sixth embodiment of FIGS. 13(a) and 13(b), the grounded electrode may comprise an aluminum drum blank D, as in the fourth embodiment of FIGS. 8(a) and 8(b). The drum blank D may be set at the central position within the reactor vessel 12 in the same manner as in FIGS. 8(a) and 8(b).

In operation, the starting gas fed by each inlet pipe 18' is first introduced into the corresponding electrode 2013a, and is then ejected from the opening holes 2013f into the hollow spaces 2013e thereof. Accordingly, a high density plasma can be obtained in each of the hollow spaces 2013e in the same manner as in the first embodiment of FIG. 1.

Furthermore, a thin film formation apparatus corresponding to the sixth embodiment of FIGS. 9(a) and 9(b) was actually assembled and was used to form a p-type a—Si:H thin film on a aluminum drum blank.

The assembled apparatus had the following characteristics:

| | |
|---|---|
| (A) Height of sector electrode (2013 a) | 560 mm |
| (B) Height of central recess (2013 b) | 560 mm |
| (C) Width of central recess (2013 b) | 14 mm |
| (D) Depth of central recess (2013 b) to shield (2013 c) | 21.5 mm |
| (E) Length of hollow space (2013 e) | 400 mm |
| (F) Width of hollow space (2013 e) | 14 mm |
| (G) Depth of hollow space (2013 e) | 20 mm |
| (H) Distance between drum blank (D) and sector electrode (2013 a) | 20 mm |
| The thin film was formed under the following conditions | |
| (A) Starting gas | Si$_2$H$_6$ |
| (B) Flow rate of starting gas | 100 sccm |
| (C) Doping gas (helium-diluted: 1000 ppm) | B$_2$H$_6$ |
| (D) Flow rate of doping gas | 100 sccm |
| (E) Pressure within reactor vessel | 0.2 torr |
| (F) Power of RF source | 250 W |
| (G) Temperature of drum blank | 300° C. |
| (H) Operation time | 20 min. |

During the operation, the potential of the discharge electrode was observed as shown in FIG. 14. Also, the thickness of the produced p-type a—Si:H thin film exhibited characteristics as shown in FIG. 15. No high-molecular weight powder was generated during the operation.

FIG. 16 shows a seventh embodiment of the present invention, which is basically similar to the thin film apparatus 10 of FIG. 1. In FIG. 16, the features similar to those of FIG. 1 are indicated by the same reference numerals, and the features corresponding to those of FIG. 1 bear like reference numerals suffixed with a prime.

In the seventh embodiment, the discharging electrode 20 comprises a generally rectangular parallelpiped-shaped electrode element 2016a that preferably extends in a direction perpendicular to the plane of the drawing sheet. The discharge electrode element 2016a includes a top wall portion 2016a$_1$, a bottom wall portion 2016a$_2$, side wall portions 2016a$_3$, and end wall portions (not shown), formed of a suitable conductive material such as a stainless steel.

The discharge electrode element 2016a has an inlet pipe 18' integrally projected from the top wall portion 2016a$_1$ thereof, and the inlet pipe 18' extends through and is joined to a top wall portion 1216a of the reactor vessel 12 (partially illustrated) through the intermediary of an insulator element 23', so that the discharge electrode 2016a is suspended from the top wall portion 1216 of the reactor vessel 12. As shown in FIG. 16, an O-ring seal 50 is applied to the inlet pipe 18' at the through hole formed in the top wall portion 1216a for receiving the inlet pipe 18', providing an airtight seal between the inlet pipe 18' and the through hole. The inlet pipe 18' leads from the starting gas source (not shown), and is connected to the RF electric source 26 through the impedance matching box 28 and the blocking capacitor 30.

The discharge electrode element 2016a is covered by a shield 24 except for the bottom wall portion 2016a$_2$ thereof, and the outer surface of the bottom wall portion 2016a₂ serves as the discharge area. The shield 24 is suspended from the top wall portion 1216a of the reactor vessel 12. An insulator element 52 is interposed between the shield 24 and the surfaces of the electrode element 2016a to be shielded, to prevent any contact therebetween.

The grounded electrode 22, which is substantially the same as in FIG. 1, is installed on the bottom 1216b, and a substrate S is placed on the grounded electrode 22. Although not illustrated a suitable electric heater is incorporated into the grounded electrode 22 for heating the substrate. An outlet pipe 16' projects from the bottom 1216b, and is adapted to be connected to a suitable vacuum pump (not shown).

The discharge electrode 2016a has a hollow space or groove 2016b formed in the bottom wall portion 2016a₂ thereof. The groove 2016b extends along the longitudinal axis of the discharge electrode element 2016a in a direction that is perpendicular to the plane of the drawing sheet, and a plurality of opening holes 2016c are formed in the bottom of the groove 2016b so as to be aligned with each other along the longitudinal axis of groove 2016b, whereby the groove 2016b is in communication with the interior chamber of the discharge electrode element 2016a. The seventh embodiment of FIG. 16 is characterized in that the outlet opening of the groove 2016b is restricted by opposed projections 2016d that extend from the opposed edges by which the outlet opening of the groove 2016b is defined. A space a between the opposed projections 2016d is suitably selected in accordance with factors such as the kind of the starting gas used, the pressure within the reactor vessel 12, and the like, so that a discharge can occur between the opposed projections 2016d. Namely, the space a cannot be so narrow that no discharge occurs therein.

In operation, the starting gas is fed into the interior chamber of the discharge electrode element 2016a through the inlet pipe 18', and is then introduced into the hollow space or groove 2016b through the opening holes 2016c. Accordingly, a high density plasma zone can be obtained in the hollow space 2016b in the same manner as in the first embodiment of FIG. 1. According to the seventh embodiment of FIG. 16, however, the density of the plasma can be further enhanced because electrons caused by the dissociation of the starting gas molecules and by collisions between ions and the groove surfaces can be confined in the groove 2016b by the opposed projections 2016d. In particular, as mentioned hereinbefore, the electrons within the hollow space or groove vibrate rapidly between the groove side surfaces (see arrow A in FIG. 16), so that when the electrons escape from the groove 2016b, they are moving obliquely toward the plane of the opening outlet of the groove 2016b (see arrow B in FIG. 16). Accordingly, the opposed projections 2016d are available to effectively confine the electrons in the groove. On the other hand, the active species dissociated from the starting gas molecules are very heavy in comparison with the electrons, so that the active species can pass through the open outlet of the groove 2016b without being subjected to an active electric influence (see arrow C in FIG. 16). In brief, according to the seventh embodiment, the growth rate of thin film and the rate of starting gas consumption can be further facilitated.

FIGS. 17(a) and 17(b) show an eighth embodiment of the present invention, which is similar to the fourth embodiment of FIGS. 8(a) and 8(b) but has the features of the seventh embodiment, as mentioned above, incorporated therein. In FIGS. 17(a) and 17(b), the features similar to those of FIGS. 8(a) and 8(b) are indicated by the same reference numerals.

In the eighth embodiment, the discharge electrode 20 comprises a double-wall cylindrical electrode element 2017a concentrically disposed within the cylindrical reactor vessel 12, and including a cylindrical inner wall portion 2017a₁, a cylindrical outer wall portion 2017a₂, and annular end wall portions 2017a₃ (FIG. 17(b)). These wall portions define an annular chamber 2017b', and the same are formed of a suitable conductive material such as a stainless steel. The discharge electrode element 2017a has an inlet pipe 18' integrally projected from the outer wall portion 2017a₂, and the inlet pipe 18' extends through and is joined to the outer wall portion 2017a₂ of the reactor vessel 12 through the intermediary of an insulator element 25. The inlet pipe 18' leads from a starting gas source (not shown), and is connected to the RF electric source 26 through the impedance matching box 28 and the blocking capacitor 30.

The annular end wall portions 2017a₃ of the discharge electrode element 2017a are covered by two annular shield plates 24' that are integrally joined to the cylindrical inner wall surface of the reactor vessel 12. In this embodiment, the cylindrical side wall of the reactor vessel 12 serves as a shield for the cylindrical outer wall portion 2017a₂ of the electrode element 2017a because of the closeness therebetween. The discharge electrode element 2017a has four hollow spaces or grooves 2017b that are formed in the cylindrical inner wall portion 2017a₁, and which extend along the longitudinal axis of the reactor vessel 12. As shown in FIG. 17(b), a plurality of longitudinally aligned opening holes 2017c are formed in the bottom of each groove 2017c. The elongated opening outlet of each groove 2017b is restricted by opposed projections 2017d extending from the opposed edges by which the outlet opening of the groove 2017b is defined, whereby the electrons can be confined in the groove 2017b, as mentioned in the seventh embodiment of FIG. 16. An outlet pipe 16' projects from the cylindrical outer wall of the reactor vessel 12, and is adapted to be connected to a suitable vacuum pump (not shown) through an adjustable valve 54.

The grounded electrode 22 comprises a drum-like electrode element 2217 is concentrically disposed within the double wall cylindrical electrode element 2017a and is formed of a suitable conductive material such as aluminum. The grounded drum-like electrode element 2217 may be supported in the same manner as in the fourth embodiment of FIGS. 8(a) and 8(b). Namely, the drum-like electrode element 2217 is fixed on the sleeve-like mount 40 by the sleeve-like clamp member 42, and is rotated by a suitable motor (not shown). In this embodiment, a plurality of substrates S are detachably attached to the drum-like electrode element 2217 at predetermined locations where a part of the material thereof is removed. As shown in FIG. 17(b), a pair of small plate-like holders 56 are secured to each of the regions where material has been removed for attaching the substrates S, so that the pair of plate-like holders 56 partially overlap the corresponding region to form a pair of channels for holding the substrate S.

As shown in FIG. 17(a), four arcuate shield plate elements 44 are partially applied to the cylindrical inner wall surface of the discharge electrode element 2017a so as to be diametrically disposed at regular intervals, whereby the discharge area is restricted so that the potential of the discharge electrode 20 can be biased toward the negative side.

In operation, the starting gas is fed into the annular chamber 2017b' of the discharge electrode element 2017a through the inlet pipe 18', and is then introduced into the hollow space or groove 2017b through the opening holes 2017c. Accordingly, a high density plasma zone can be obtained in the hollow spaces 2017b in the same manner as in the seventh embodiment of FIG. 16.

A thin film formation apparatus corresponding to the eighth embodiment of FIGS. 17(a) and 17(b) was actually assembled, and a—Si:H thin films were formed on substrates.

The assembled apparatus had the following characteristics:

| (A) Width of hollow space (2017 b) | 7 mm |
|---|---|
| (B) Depth of hollow space (2017 b) | 30 mm |

In the assembled apparatus, the projected length of the opposed projections (2017d) was varied:

Thin film were formed under the following conditions:

| (A) Power of RF | 300 W |
|---|---|
| (B) Pressure within reactor vessel | 50 mtorr |

Also, as the starting gas, a $Si_2H_6$ gas and a mixed gas of $Si_2H_6$ and He (1:1) were used. The flow rate of the $Si_2H_6$ gas was 100 sccm, and the flow rate of the mixed gas of $Si_2H_6$ and He was 200 sccm. Opposed projections 2017d having lengths of 1.0 mm, 1.5 mm and 2.0 mm were used alternatively.

The a—Si:H thin films thus produced were evaluated with respect to the growth rate of the thin film, and the results are shown in FIG. 18. As is apparent from FIG. 18, when the length of projection 2017d was 1.5 mm, the rate of thin film formation was maximized, but when the length was 2.0 mm, the growth rate of the thin film was greatly reduced. This means that the opening outlet of the hollow space was too restricted and thus the discharge could occur only with difficulty.

FIG. 19 shows a ninth embodiment of the present invention, which is constructed substantially in the same manner as the seventh embodiment of FIG. 16, except for one portion thereof. In particular, these embodiments differ from each other only in that opposed projections 2016d are used for confining the electrons in the hollow space 2016b in the seventh embodiment of FIG. 16, whereas magnetic embodiments 58 are used for the same purpose in this ninth embodiment. Accordingly, in FIG. 19, the same reference numerals as in FIG. 16 are used to indicate the same elements. The magnetic elements 58 are disposed within the interior chamber of the discharge electrode element 2016a so as to surround the opening outlet of the hollow space 2016b, whereby the electrons within the hollow space 2016b are subjected to the Lorentz force and confined therein. Furthermore, the electrons are subjected to a spiral motion due to the magnetic elements 58, so that the probability of collision between the electrons and starting gas molecules is further increased, whereby the growth rate of the thin film and the percentage of starting gas consumption can be considerably enhanced.

Figure 20:
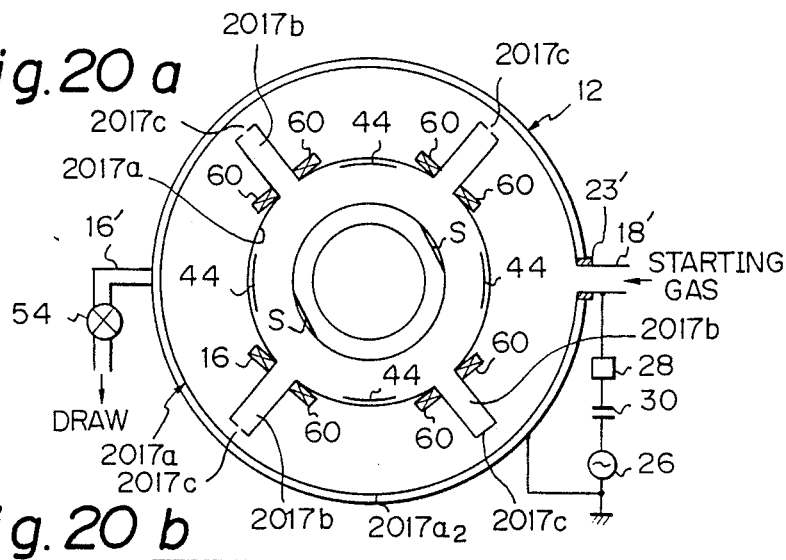
Figure 20:
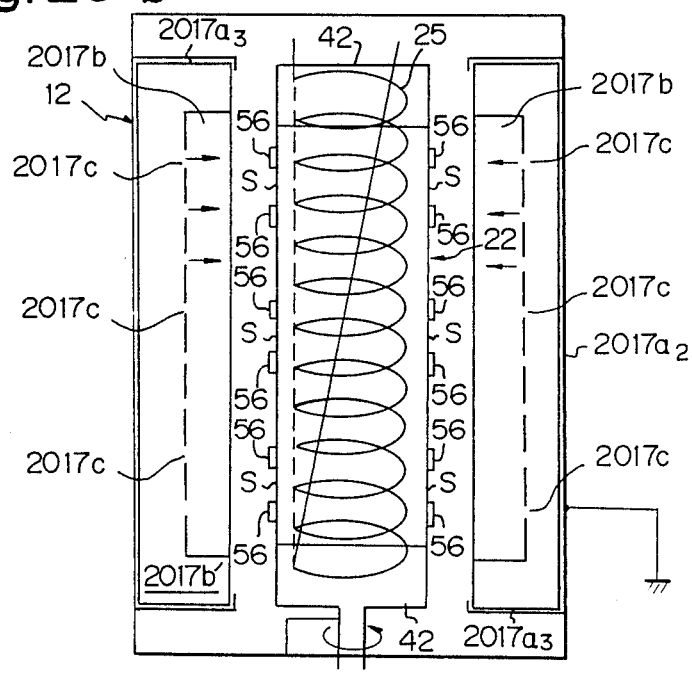

FIG. 20(a) and (b) show a tenth embodiment of the present invention, which is constructed substantially in the same manner as the eighth embodiment of FIGS. 17(a) and 17(b), except for one portion thereof. In particular, these embodiment differ from each other only in that opposed projections 2017d are used for confining the electrons in the hollow spaces 2017b in the eighth embodiment of FIGS. 17(a) and 17(b), whereas magnetic elements 60 are used for the same purpose in this tenth embodiment. Accordingly, in FIG. 20, the same reference numerals as in FIGS. 17(a) and 17(b) are used to indicate the same elements. The magnetic elements 60 are disposed within the interior annular chamber 2017b' of the discharge electrode element 2017a so as to surround the opening outlet of each hollow space 2017b.

A thin film formation apparatus corresponding to the tenth embodiment of FIGS. 20(a) and 20(b) was actually assembled, and a—Si:H thin films were formed on substrates.

The assembled apparatus had the following characteristics:

| (A) Width of hollow space (2017 b) | 8 mm |
|---|---|
| (B) Depth of hollow space (2017 b) | 30 mm |

Thin films were formed under the following conditions:

| (A) Power of RF source | 800 W |
|---|---|
| (B) Pressure within reactor vessel | 50 mtorr |

Also, as the starting gas, a $Si_2H_6$ gas and a mixed gas of $Si_2H_6$ and He (1:1) were used alternatively. The flow rate of the $Si_2H_6$ gas was 100 sccm, and the flow rate of the mixed gas of $Si_2H_6$ and He was 200 sccm.

Thin films were also formed under the same conditions as mentioned above except that the magnetic elements (60) were not used.

The thus produced a—Si:H thin films were evaluated with respect to the growth rate of the thin film, and the results are shown in the following table:

|  | magnetic | non-magnetic |
|---|---|---|
| $Si_2H_6$ | 7.1 μm/h | 3.6 μm/h |
| $Si_2H_6$ + He | 4.3 μm/h | 1.2 μm/h |

Although the embodiments of the present invention are especially explained above with respect to the formation of a—Si:H thin films, obviously, the present invention can be applied to the formation of other types of thin films such as a—SiC:H, a—SiGe:H, a—SiN:H, micro-crystallized silicon, a—C:H, $Si_{1-x}N_x$ ($0<x<1$), $Si_{1-x}O_x$ ($0<x<1$), $W_2Si_3$, BN, $B_4C$, SiC, and the like.

Finally, it will be understood by those skilled in the art that the foregoing description is of the preferred embodiments of the present invention, and that various changes and modifications can be made without departing from the spirit and scope thereof.

We claim;

1. An apparatus for forming thin films on substrates, comprising:
   a reactor vessel;
   first and second electrodes opposably disposed within said reactor vessel, said first electrode including walls defining a hollow space which has an outlet that is open to said second electrode;

introduction means for introducing a starting gas into said reactor vessel through the hollow space of said first electrode; and a circuit means including a radio frequency electric source for applying a radio frequency voltage between said first and second electrodes to produce a discharge plasma zone therebetween for dissociating the starting gas, the walls defining said hollow space being arranged in such a manner that a discharge plasma is generated within the hollow space, said circuit means being arranged so that the first electrode is a discharge electrode and said second electrode is grounded, said circuit means further including biasing means for biasing the potential of said first electrode toward the negative side, whereby a high density plasma is produced in said hollow space and dissociation of starting gas introduced therein is facilitated.

2. An apparatus as set forth in claim 1, wherein said biasing means comprises a blocking capacitor and said first electrode has a discharge area that is smaller than the area of said second electrode that is opposed to the discharge area of said first electrode.

3. An apparatus as set forth i claim 1, wherein said biasing means comprises a direct current voltage source.

4. An apparatus as set forth in claim 1, wherein the hollow space of said first electrode is formed such that at least one opening hole is formed in one of the walls defining said hollow space for allowing starting gas ejecting from the introduction means to enter the hollow space.

5. An apparatus as set forth in claim 4, wherein the walls defining the hollow space include a sleeve element attached to said first electrode.

6. An apparatus as set forth in claim 1, wherein the walls defining the hollow space include a conductive mesh element attached to said first electrode, said introduction means including a pipe element which surrounds said conductive mesh element, and which has at least one opening hole formed therein for ejecting the starting gas through the mesh element and into the hollow space.

7. An apparatus as set forth in claim 4, wherein said first electrode has a hollow construction presenting an interior plenum chamber for the starting gas, the hollow space of said first electrode being in the form of a recess groove in said first electrode, said opening hole being formed at the bottom of said groove for intercommunicating the plenum chamber and the groove.

8. An apparatus as set forth in claim 1, wherein said first electrode comprises at least two electrode elements, each having a sector-shaped hollow construction, said second electrode being formed as a drum-shaped element, and being adapted to be rotated, the sector-shaped electrode being circumferentially and concentrically disposed around said drum-shaped element at regular intervals, each of the sector-shaped electrode elements having said walls defining at least one hollow space formed as a groove recessed in an inner wall of the hollow construction thereof, each sector-shaped element including at least one opening hole formed at the bottom of said groove for allowing starting gas ejected from the introduction means to enter the hollow space.

9. An apparatus as set forth in claim 1, wherein said first electrode has an annular-shaped hollow construction, said second electrode being formed as a drum-shaped element, and being adapted to be rotated, said second electrode being circumferentially and concentrically disposed with the annular-shaped hollow construction of said first electrode, the hollow space of said first electrode being formed as at least one groove recessed in an inner wall of the hollow construction thereof, said first electrode including at least one opening hole formed at the bottom of said groove allowing starting gas ejected from the introduction means to enter the hollow space.

10. An apparatus as set forth in claim 4, wherein said first electrode comprises more than one discharging electrode elements, each of said discharge electrode elements having a said hollow space formed therein and at least one said opening hole formed in a wall thereof.

11. An apparatus as set forth in claim 1, wherein the outlet of the hollow space of said first electrode is restricted by opposed projections formed as part of said first electrode, whereby electrons included in a high density plasma produced in said hollow space are confined therein.

12. An apparatus as set forth in clam 1, wherein said first electrode includes at least one magnet element disposed to surround the outlet of the hollow space, whereby electrons included in a high density plasma produced in said hollow space are confined therein and subjected to a spin motion due to the presence of the magnet element.

* * * * *

UNITED STATES PATENT AND TRADEMARK OFFICE
CERTIFICATE OF CORRECTION

PATENT NO. : 4,979,467
DATED : December 25, 1990
INVENTOR(S) : HIDEKI KAMIJI and SHIN ARAKI It is certified that error appears in the above-identified patent and that said Letters Patent is hereby corrected as shown below:

Column 5, line 46, "Views" should be --views--.

Column 6, line 14, "an" should be --and--.

Column 7, line 25, "is" should be --are--;

line 37, "2" should be --20--.

Column 10, line 65, ">" should be --≥--.

Column 17, line 19, "cf" should be --of--;

line 32, "Within" should be --within--.

Column 21, line 28, "i" should be --in--.

Signed and Sealed this

Eleventh Day of August, 1992

*Attest:*

DOUGLAS B. COMER

*Attesting Officer*     *Acting Commissioner of Patents and Trademarks*